(12) United States Patent
Choi et al.

(10) Patent No.: US 9,419,004 B2
(45) Date of Patent: Aug. 16, 2016

(54) FUSE STRUCTURE AND SEMICONDUCTOR DEVICE INCLUDING THE SAME

(71) Applicant: SAMSUNG ELECTRONICS CO., LTD., Suwon-Si, Gyeonggi-Do (KR)

(72) Inventors: Hyun-Min Choi, Uiwang-Si (KR); Shigenobu Maeda, Seongnam-Si (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 14/575,647

(22) Filed: Dec. 18, 2014

(65) Prior Publication Data

US 2015/0255469 A1 Sep. 10, 2015

(51) Int. Cl.
*H01L 23/52* (2006.01)
*H01L 27/112* (2006.01)
*H01L 23/525* (2006.01)
*H01L 29/78* (2006.01)
*H01L 27/06* (2006.01)

(52) U.S. Cl.
CPC ...... *H01L 27/11206* (2013.01); *H01L 23/5256* (2013.01); *H01L 29/785* (2013.01); *H01L 27/0629* (2013.01)

(58) Field of Classification Search
CPC ............. H01L 27/11206; H01L 23/5256; H01L 29/788
USPC .......................................... 257/209
See application file for complete search history.

(56) References Cited

U.S. PATENT DOCUMENTS

| | | |
|---|---|---|
| 7,087,499 B2 | 8/2006 | Rankin et al. |
| 7,960,760 B2 | 6/2011 | Marshall |
| 8,030,736 B2 | 10/2011 | Booth, Jr. et al. |
| 8,274,132 B2 | 9/2012 | Russ et al. |
| 8,524,567 B2 | 9/2013 | Kurz et al. |
| 8,569,116 B2 | 10/2013 | Mann et al. |
| 2007/0029576 A1 | 2/2007 | Nowak et al. |
| 2010/0244144 A1 | 9/2010 | Hsueh et al. |
| 2013/0105895 A1 | 5/2013 | Liang et al. |
| 2013/0153960 A1 | 6/2013 | Yang |
| 2014/0346603 A1* | 11/2014 | Toh ................... H01L 27/11206 257/350 |

FOREIGN PATENT DOCUMENTS

KR 10-2009-0088679 8/2009

* cited by examiner

*Primary Examiner* — Elias M Ullah
(74) *Attorney, Agent, or Firm* — F. Chau & Associates, LLC

(57) ABSTRACT

A fuse structure includes a first fin pattern disposed in a field insulating layer that includes an upper surface that projects above an upper surface of the field insulating layer, a conductive pattern on the field insulating layer that crosses the first fin pattern, a first semiconductor region positioned on at least one side of the conductive pattern, and first and second contacts disposed on the conductive pattern on each side of the first fin pattern. The fuse structure may be included in a semiconductor device.

19 Claims, 40 Drawing Sheets

FUSE STRUCTURE AND SEMICONDUCTOR DEVICE INCLUDING THE SAME

CROSS-REFERENCE TO RELATED APPLICATIONS

This application claims priority under 35 U.S.C. §119 from Korean Patent Application No. 10-2014-0040081 filed on Apr. 3, 2014 in the Korean Intellectual Property Office, and all the benefits accruing therefrom, the contents of which are herein incorporated by reference in their entirety.

BACKGROUND

1. Technical Field

Embodiments of the present disclosure are directed to a fuse structure and a semiconductor device including the same.

2. Discussion of the Prior Art

In the semiconductor field, a fuse may be used for various purposes. For example, in the case of a memory device, a fuse is used in a repair process to replace an inferior memory cell by a redundancy memory cell to improve the yield of a chip. In addition to the repair process, a fuse may be used to customize a chip to optimize chip characteristics in a stage subsequent to a chip identification step that records information on a chip fabrication history or fabrication-out.

Such a fuse may be briefly classified into a laser fuse and an e-fuse based on a programming method. A laser fuse is configured to be selectively programmed (i.e., short-circuited) using a laser, and an e-fuse is configured to be selectively programmed using current.

SUMMARY

Embodiments of the present disclosure can provide a fuse structure that can improve fusing performance by using a conductive pattern that includes portions with different thicknesses.

Further embodiments of the present disclosure can provide a semiconductor device that includes a fuse structure that can improve fusing performance by using a conductive pattern that includes portions with different thicknesses.

Additional features of embodiments of the disclosure will be set forth in part in the description which follows and in part will become apparent to those having ordinary skill.

In one embodiment of the present disclosure, there is provided a fuse structure that includes a first fin pattern disposed in a field insulating layer that includes an upper surface that projects above an upper surface of the first field insulating layer, a conductive pattern on the field insulating layer that crosses the first fin pattern, a first semiconductor region positioned on at least one side of the conductive pattern, and first and second contacts disposed on the conductive pattern on each side of the first fin pattern.

The conductive pattern has a first thickness on the first fin pattern, and a second thickness on the field insulating layer, and the first thickness and the second thickness differ from each other.

The first thickness is less than the second thickness.

A width of a region where the conductive pattern overlaps the first fin pattern is equal to a width of the conductive pattern, and the first semiconductor region is positioned on each side of the conductive pattern.

The field insulating layer may comprise a first region and a second region, and the first region of the field insulating layer is in contact with a long side of the first fin pattern, the second region of the field insulating layer is in contact with a short side of the first fin pattern, and a height of the second region is higher than a height of the first region.

An upper surface of the second field insulating layer is parallel to an upper surface of the first fin pattern.

A portion of the conductive pattern is disposed on the second field insulating layer.

The first semiconductor region is electrically floated.

The fuse structure may further comprise a third contact on the first semiconductor region.

The fuse structure may further comprise a metal alloy layer disposed on an upper surface of the first semiconductor region.

The metal alloy layer is disposed on a perimeter of the first semiconductor region.

The metal alloy layer may include silicide.

The fuse structure may further comprise an interlayer insulating layer covering the first fin pattern and the first semiconductor region that includes a trench that crosses the first fin pattern, and the conductive pattern is disposed in the trench.

An upper surface of the interlayer insulating layer is coplanar with an upper surface of the conductive pattern.

The fuse structure may further comprise a trench in the first fin pattern on each side of the conductive pattern.

The fuse structure may further comprise a second fin pattern disposed in the field insulating layer that includes an upper surface that projects above an upper surface of the field insulating layer and that crosses the conductive pattern, and a second semiconductor region positioned on at least one side of the conductive pattern portion.

The first semiconductor region is connected to the second semiconductor region.

An air gap is disposed between the first semiconductor region and the second semiconductor region.

The first fin pattern and the second fin pattern are disposed between the first and second contacts.

The first fin pattern includes a first portion upon which the conductive pattern is disposed, and a second portion on each side of the first portion upon which the first semiconductor region is positioned.

The first portion of the first fin pattern is not used as a channel region.

Different voltages are respectively supplied to the first contact and the second contact.

In another embodiment of the present disclosure, there is provided a fuse structure that includes a fin pattern that extends in a first direction, and a conductive pattern that extends in a second direction different from the first direction and that crosses the fin pattern. A first thickness of a first region of the conductive pattern that crosses the fin pattern is less than a second thickness of a second region of the conductive pattern that does not cross the fin pattern, and a fuse is programmed by applying an electric signal to both ends of the conductive pattern, wherein a resistance of the first region increases.

A first width of the first region is equal to a second width of the second region.

In still another embodiment of the present disclosure there is provided a semiconductor device that includes first and second fin patterns parallel to each other in a lengthwise direction that are disposed on a first field insulating layer, the first and second fin patterns each including an upper surface that projects above an upper surface of the first field insulating layer, a conductive pattern on the first field layer that crosses the first fin pattern, first and second contacts disposed on the conductive pattern on each side of the first fin pattern that have different voltages applied thereto, a first gate electrode disposed on the first field insulating layer that crosses the second fin pattern, and a source/drain disposed on each side of the first gate electrode, where one side of the source/drain is electrically connected to the first contact.

The conductive pattern has a first thickness on the first fin pattern, and a second thickness on the first field insulating layer, and the first thickness differs from the second thickness.

A width of a region where the conductive pattern overlaps the first fin pattern is equal to a width of the conductive pattern.

The first fin pattern is directly connected to the second fin pattern

The semiconductor device may further include a second gate electrode disposed on the first field insulating layer between the conductive pattern and the first gate electrode, and the second gate electrode crosses one or both of the first fin pattern and the second fin pattern, and the second gate electrode is electrically floated.

The semiconductor device may further comprise a second field insulating layer positioned between the first fin pattern and the second fin pattern.

A portion of the conductive pattern is disposed on the second field insulating layer.

The semiconductor device may further include a second gate electrode disposed on the second field insulating layer, and the second gate electrode is electrically floated.

An upper surface of the second field insulating layer is higher than an upper surface of the first field insulating layer.

The first field insulating layer is in contact with a long side of the first fin pattern and a long side of the second fin pattern, and the second field insulating layer is in contact with a short side of the first fin pattern and a short side of the second fin pattern.

The semiconductor device may further comprise at least one third fin pattern disposed in the first field insulating layer that faces and is parallel to the second fin pattern, and an upper surface of the at least one third fin pattern projects above an upper surface of the first field insulating layer.

The semiconductor device may further comprise at least one fourth fin pattern disposed in the first field insulating layer that faces and is parallel to the first fin pattern and that crosses the first gate electrode, and an upper surface of the at least one fourth fin pattern projects above the upper surface of the first field insulating layer.

A total number of first fin patterns and fourth fin patterns differs from a total number of second fin pattern and third fin pattern.

The semiconductor device may further include a third contact electrically connected to the first gate electrode, and an area of the first contact is greater than an area of the third contact, and an area of the second contact is greater than the area of the third contact.

The semiconductor device may further include a semiconductor region positioned on at least one side of the conductive pattern.

The semiconductor region may be positioned on each side of the conductive pattern.

The source/drain includes a first epitaxial layer, and the semiconductor region includes a second epitaxial layer that fills a trench in the first fin pattern.

The semiconductor device may further comprise a metal alloy layer disposed on an upper surface of the source/drain, and no metal alloy layer is disposed on an upper surface of the semiconductor region.

The semiconductor region is electrically floated.

DETAILED DESCRIPTION OF EXEMPLARY EMBODIMENTS

Exemplary embodiments of the present disclosure will now be described more fully hereinafter with reference to the accompanying drawings, in which exemplary embodiments of the disclosure are shown. Embodiments of this disclosure may, however, be embodied in different forms and should not be construed as limited to the embodiments set forth herein. The same reference numbers may indicate the same components throughout the specification. In the attached figures, the thickness of layers and regions may be exaggerated for clarity.

It will be understood that when an element or layer is referred to as being "connected to," or "coupled to" another element or layer, it can be directly connected to or coupled to another element or layer or intervening elements or layers may be present. It will also be understood that when a layer is referred to as being "on" another layer or substrate, it can be directly on the other layer or substrate, or intervening layers may also be present.

Hereinafter, referring to FIGS. 1 to 5, a fuse structure according to an embodiment of the present disclosure will be described.

Figure 1:
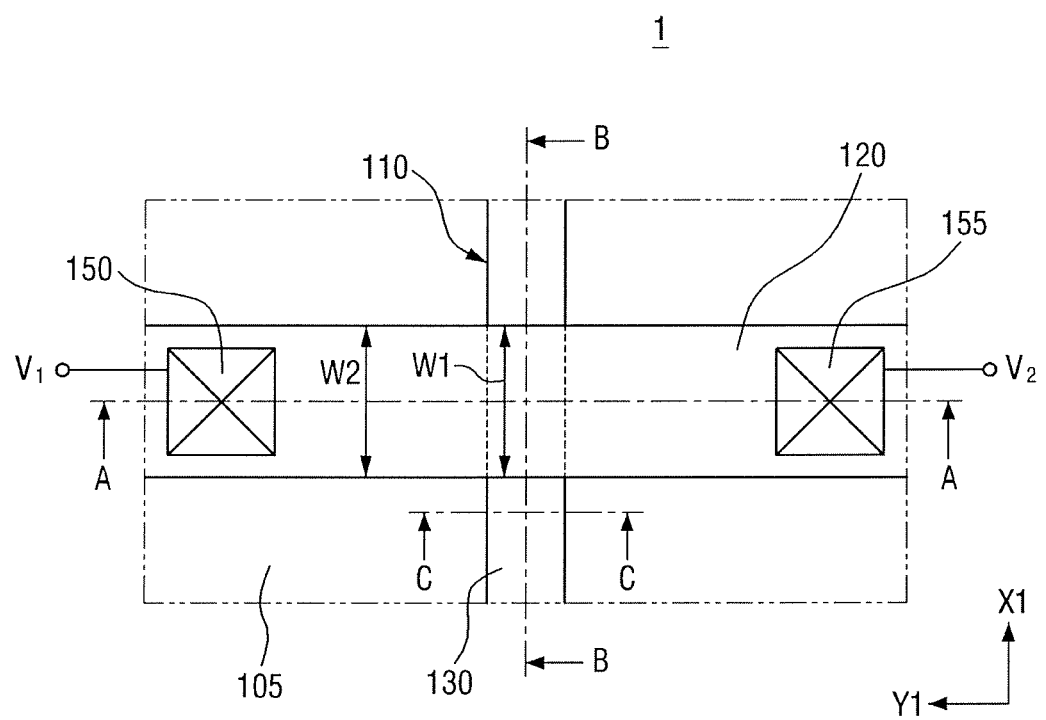
FIGS. 1 and 2 are a layout diagram and a perspective view of a fuse structure according to an embodiment of the present disclosure.
Figure 2:
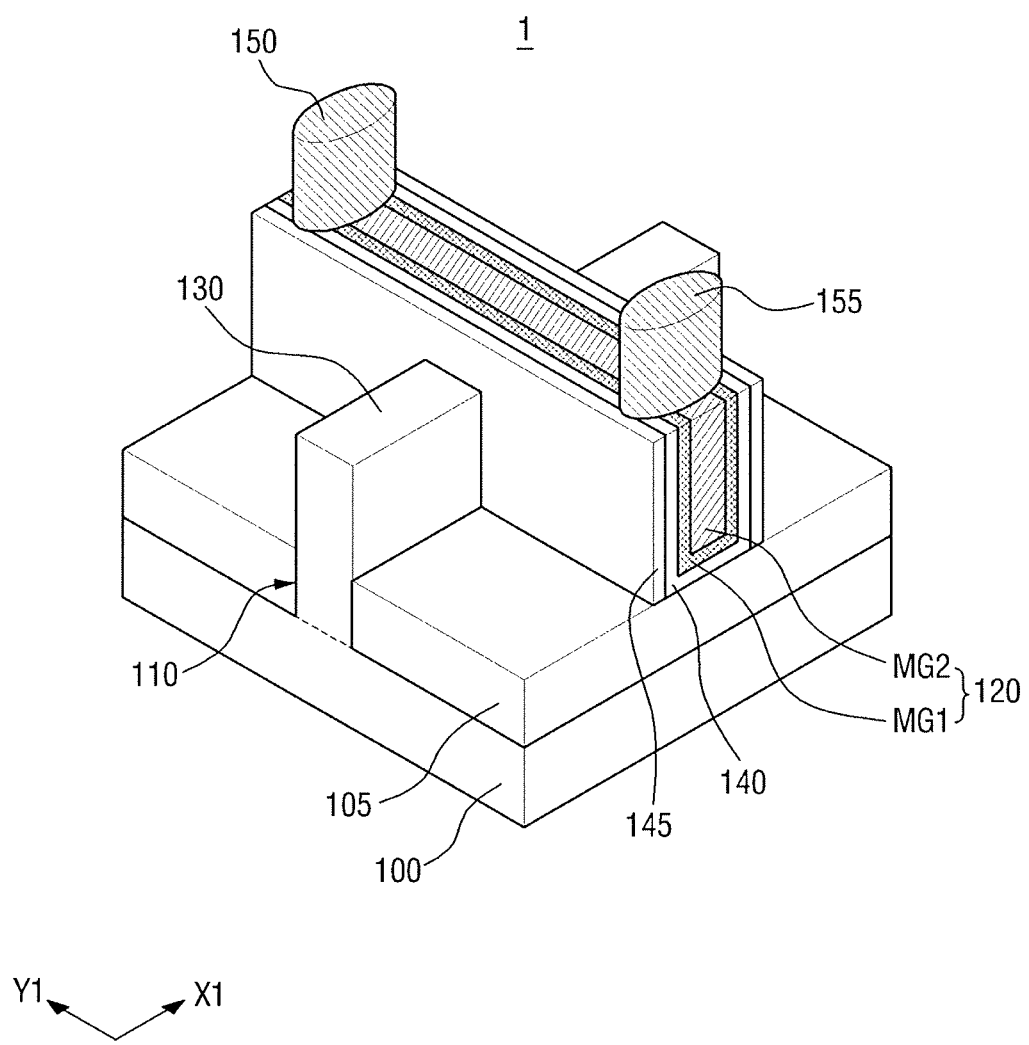
Figure 3:
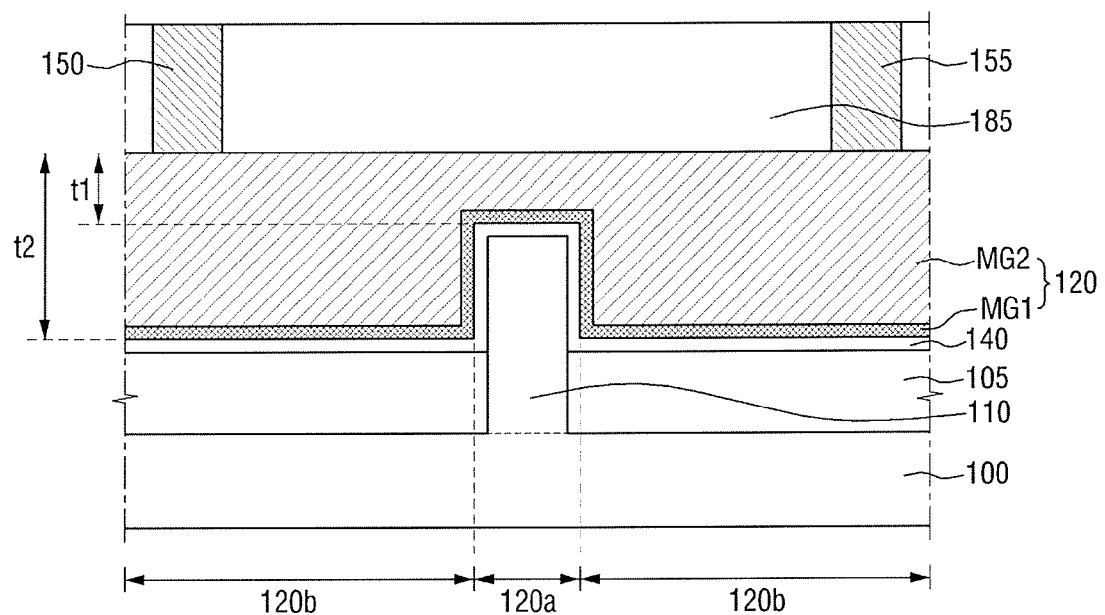
FIG. 3 is a cross-sectional view cut along line A-A of FIG. 1.
Figure 4:
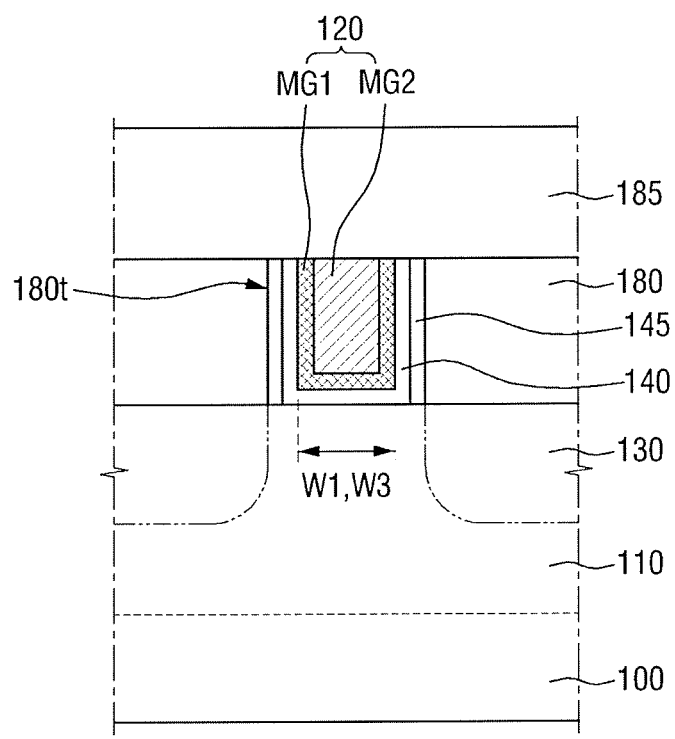
FIG. 4 is a cross-section view cut along line B-B of FIG. 1.
Figure 5:
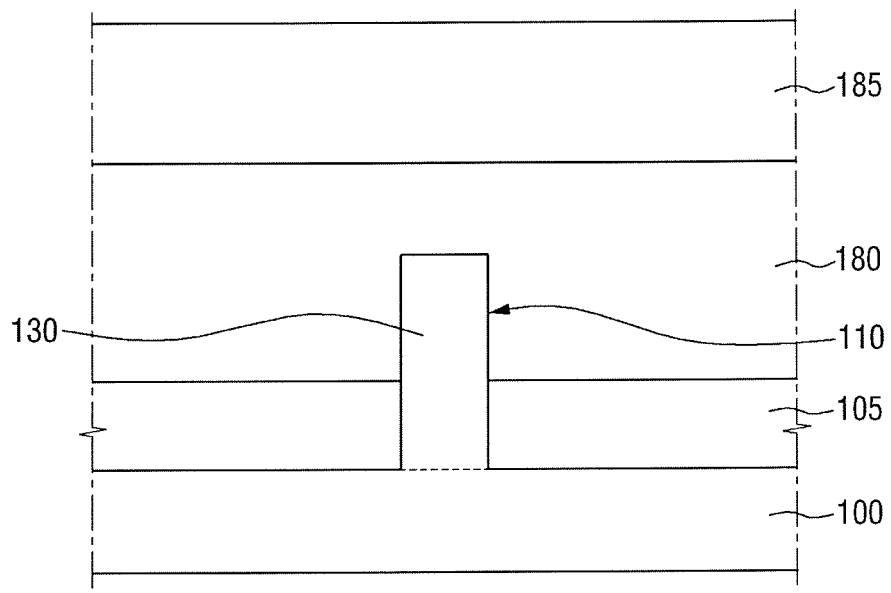
FIG. 5 is a cross-sectional view cut along line C-C of FIG. 1.

FIGS. 1 and 2 are a layout diagram and a perspective view of a fuse structure, respectively, according to an embodiment of the present disclosure. FIG. 3 is a cross-sectional view cut along line A-A of FIG. 1, FIG. 4 is a cross-section view cut along line B-B of FIG. 1, and FIG. 5 is a cross-sectional view cut along line C-C of FIG. 1. For convenience in explanation, a first interlayer insulating layer 180 and a second interlayer insulating layer 185 are not illustrated in FIG. 2.

Referring to FIGS. 1 to 5, a fuse structure 1 according to an embodiment of the present disclosure may include a substrate 100, a field insulating layer 105 on the substrate 100, a first fin pattern 110, a first conductive pattern 120, a first semiconductor region 130, a first contact 150, and a second contact 155.

The substrate 100 may include, for example, bulk silicon or SIO (Semiconductor On Insulator). Alternatively, the substrate 100 may be a silicon substrate or may be made of another material, such as silicon germanium, indium antimonide, lead telluride, indium phosphide, gallium arsenide, or gallium antimonide. Further, the substrate 100 may be fabricated by forming an epitaxial layer on a base substrate.

The first fin pattern 110 may project from the substrate 100. The field insulating layer 105 covers a part of a side surface of the first fin pattern 110, and an upper surface of the first fin pattern 110 may project higher than an upper surface of the field insulating layer 105. The first fin pattern 110 may be defined by the field insulating layer 105, in that the first fin pattern 110 is disposed in and projects above the field insulating layer 105. The first fin pattern 110 may extend along a first direction X1.

The field insulating layer 105 may include, for example, one of an oxide layer, a nitride layer, an oxynitride layer, and a combination thereof.

The first fin pattern 110 may be a part of the substrate 100, and may include an epitaxial layer grown from the substrate 100. The first fin pattern 110 may include, for example, silicon or germanium, which are elemental semiconductors. Further, the first fin pattern 110 may include a compound semiconductor, and may include, for example, a group IV-IV compound semiconductor or a group III-V compound semiconductor. Specifically, as an example of a group IV-IV compound semiconductor, the first fin pattern 110 may include a binary compound that includes at least two of carbon (C), silicon (Si), germanium (Ge) and tin (Sn), a ternary compound, or compound that is obtained by doping group IV elements in the above-described compound. As an example of a group III-V compound semiconductor, the first fin pattern 110 may include a binary compound that is a combination of at least one group III element, such as aluminum (Al), gallium (Ga), and indium (In), and one group V element, such as phosphorus (P), arsenic (As), and antimony(Sb), a ternary compound, and a quaternary compound.

In a fuse structure according to embodiments of the present disclosure, the first fin pattern 110 may include silicon.

A first interlayer insulating layer 180 is disposed on the field insulating layer 105 and the first fin pattern 110. The first interlayer insulating layer 180 may include, for example, at least one of a low-k material, an oxide layer, a nitride layer, and oxynitride layer. The low-k material may include, for example, FOX (Flowable Oxide), TOSZ (Tonen SilaZen), USG (Undoped Silica Glass), BSG (Borosilica Glass), PSG (PhosphoSilica Glass), BPSG (BoroPhosphoSilica Glass), PETEOS (Plasma Enhanced Tetra Ethyl Ortho Silicate), FSG (Fluoride Silicate Glass), HDP (High Density Plasma) oxide, PEOX (Plasma Enhanced Oxide), FCVD (Flowable chemical vapor deposition) oxide, or a combination thereof, but is not limited thereto.

The second interlayer insulating layer 185 is disposed on the first interlayer insulating layer 180. The second interlayer insulating layer 185 may include, for example, at least one of a low-k material, an oxide layer, a nitride layer, and an oxynitride layer.

The first conductive pattern 120 may be disposed on the field insulating layer 105 and the first fin pattern 110. The first conductive pattern 120 is disposed in a first trench 180t in the first interlayer insulating layer 180. The first conductive pattern 120 may extend in a second direction Y1.

In a fuse structure according to embodiments of the present disclosure, an upper surface of the first conductive pattern 120 may be coplanar with an upper surface of the first interlayer insulating layer 180.

At least a part of the first conductive pattern 120 may cross the first fin pattern 110. In a fuse structure according to an embodiment of the present disclosure, the first conductive pattern 120 may directly cross the first fin pattern 110. That is, letting a width of the first conductive pattern 120 be a first width W1 and a width of the overlap region of first conductive pattern 120 and the first fin pattern 110 be a third width W3, the width W1 of the first conductive pattern 120 is equal to the width W3 of the overlap region of the first fin pattern 110 and the first conductive pattern 120.

The first conductive pattern 120 includes a first region 120a that crosses the first fin pattern 110 and a second region 120b that does not cross the first fin pattern 110. The first region 120a includes not only the region that directly crosses the first fin pattern 110, but also regions that cross the field insulating layer 105 in neighborhoods adjacent to each side of the first fin pattern 110. The second region 120b extends in the second direction Y1 on each side of the first region 120a of the first conductive pattern.

Let the second region 120b of the first conductive pattern have a second width W2. Then, the width WI of the first region 120a may be equal to the width W2 of the second region 120b.

Let the thickness of the first region 120a of the first conductive pattern be a first thickness t1 and the thickness of the second region 120b of the first conductive pattern be a second thickness t2. Then, the thickness t1 of the first region 120a may differ from the thickness t2 of the second region 120b.

In a fuse structure according to embodiments of the present disclosure, the thickness t1 of the first region 120a is less than the thickness t2 of the second region 120b.

In other words, the thickness t1 of the first conductive pattern 120 on the first fin pattern 110 is different from the thickness t2 of the first conductive pattern 120 on the field insulating layer 105. More specifically, the thickness t2 of the first conductive pattern 120 on the field insulating layer 105 is greater than the thickness t1 of the first conductive pattern 120 on the first fin pattern 110.

The first conductive pattern 120 may include metal layers MG1 and MG2. As illustrated, the first conductive pattern 120 may be formed by stacking two or more metal layers MG1 and MG2. The first metal layer MG1 may adjust a work function of a gate electrode of a transistor, or may prevent diffusion of the second metal layer MG2. The second metal layer MG2 may fill a space in the first metal layer MG1. For example, the first metal layer MG1 may include at least one of TiN, TaN, TiC, TaC, Ta, TaSiN, TiSiN, W, and WN. Further, the second metal layer MG2 may include tungsten (W), aluminum (Al), copper (Cu), or a copper alloy. The copper alloy may include a small amount of C, Ag, Co, Ta, In, Sn, Zn, Mn, Ti, Mg, Cr, Ge, Sr, Pt, Mg, Al, or Zr in copper. The first conductive pattern 120 may include Si or SiGe rather than a metal. The first conductive pattern 120 as described above may be formed through a replacement process, but is not limited thereto.

The first semiconductor region 130 may be positioned on at least one side of the first conductive pattern 120. In a fuse structure according to an embodiment of the present disclosure, the first semiconductor region 130 may be positioned on each side of the first conductive pattern 120. That is, the first semiconductor region 130 may extend in the first direction X1 on each side of the first conductive pattern 120.

In a fuse structure according to an embodiment of the present disclosure, the first semiconductor region 130 may be a part of the first fin pattern 110.

Further, the first semiconductor region 130 may include a p-type impurity or an n-type impurity, but is not limited thereto. That is, the first semiconductor region 130 may not necessarily have an impurity injected or doped thereinto.

In a fuse structure according to embodiments of the present disclosure, the first semiconductor region 130 may be electrically floated. That is, an electrical signal is not applied to the first semiconductor region 130. Accordingly, electrons or holes do not flow between the first semiconductor region 130 positioned on each side of the first conductive pattern 120.

Referring to FIGS. 1 and 4, the first fin pattern 110 includes a first portion that crosses the first conductive pattern 120 and a second portion that extends in the first direction X1 on each side of the first portion. The first conductive pattern 120 may be disposed on the first portion of the first fin pattern 110, and the first semiconductor region 130 may be positioned on the second portion of the first fin pattern 110.

Since the first semiconductor region 130 is electrically floated and electrons or holes do not flow between the first semiconductor regions 130, the first portion of the first fin pattern 110 is not used as a channel region. That is, the portion of the first fin pattern 110 that overlaps the first conductive pattern 120 is not used as a channel region through which electrons or holes may flow.

A fuse spacer 145 may be disposed on a side wall of the first trench 180t. The fuse spacer 145 may be disposed between the first interlayer insulating layer 180 and the first conductive pattern 120. That is, the fuse spacer 145 may be disposed on the side wall of the first conductive pattern 120 that extends in the second direction Y1.

The fuse spacer 145 may include, for example, at least one of silicon nitride (SiN), silicon oxynitride (SiON), silicon oxide ($SiO_2$), silicon oxide carbon nitride (SiOCN), and a combination thereof. The fuse spacer 145 is illustrated as a single layer, but is not limited thereto. The fuse spacer 145 may have a multilayer structure.

A fuse insulating layer 140 may be disposed between the fin pattern 110 and the first conductive pattern 120. The fuse insulating layer 140 may be disposed on an upper surface and a side surface of the first fin pattern 110 where the first fin pattern 110 overlaps the first conductive pattern 120. Further, the fuse insulating layer 140 may also be disposed between the first conductive pattern 120 and the field insulating layer 105.

The fuse insulating layer 140 may include silicon oxide, silicon nitride, silicon oxynitride, or a high-k material. For example, the high-k material may include, but is not limited to, at least one of hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate.

A first contact 150 and a second contact 155 are disposed on the first conductive pattern 120. The first contact 150 and the second contact 155 may penetrate the second interlayer insulating layer 185, but the contacts are not limited thereto.

The first contact 150 and the second contact 155 are disposed on each side of the first fin pattern 110 on the second region 120b of the first conductive pattern that does not cross the first fin pattern 110. The first contact 150 and the second contact 155 are spaced apart from each side of the first fin pattern 110 in the second direction Y1.

The first contact 150 and the second contact 155 are electrically connected to external wirings and the first conductive pattern 120. For example, the first contact 150 may be connected to a first voltage V1, and the second contact 155 may be connected to a second voltage V2. For example, the first contact 150 may be connected to an anode and the second contact 155 may be connected to a cathode, but the contacts are not limited thereto.

In a fuse structure according to embodiments of the present disclosure, the first voltage V1 and the second voltage V2 are different voltages. The first contact 150 and the second contact 155 respectively apply the first voltage V1 and the second voltage V2 to the first conductive pattern 120.

The second region 120b electrically connected to the first contact 150, and the second region 120b electrically connected to the second contact 155, are respectively connected to different voltages. That is, different voltages are applied to the second regions 120b on each side of the first region 120a of the first conductive pattern. Accordingly, the first conductive pattern 120, which extends in the second direction Y1, may be used as a current path.

The first contact 150 and the second contact 155 may include, for example, Al, Cu, and W, but are not limited thereto.

Referring to FIGS. 1 and 3, the effect of the fuse structure 1 according to an embodiment of the present disclosure will be described.

If the first voltage V1 is applied to the first contact 150 and the second, different voltage V2 is applied to the second contact 155, current flows through the first conductive pattern 120. It may be assumed that the current flows from the first contact 150 to the second contact 155.

The width W2 of the second region 120b on which the first and second contacts 150 and 155 are disposed is equal to the width W1 of the first region 120a that crosses the first fin pattern 110. However, the thickness t1 of the first region 120a is less than the thickness t2 of the second region 120b.

That is, in comparing cross-sectional areas through which current flows, the cross-sectional area of the second region 120b is greater than the cross-sectional area of the first region 120a.

When a constant current flows through a conductive line, the current density is in inverse proportion to the cross-sectional area of the conductive line. Accordingly, between the first contact 150 and the second contact 155 through which a constant current flows, the current density in the first region 120a is greater than the current density in the second region 120b. That is, the current density abruptly increases in the first region 120a that crosses the first fin pattern 110.

Accordingly, if an electrical signal is applied to both ends of the first conductive pattern 120 that crosses the first fin pattern 110, the current density abruptly increases in the first region 120a of the first conductive pattern. Through this, a void may occur in the first region 120a of the first conductive pattern, or the first region 120a of the first conductive pattern may be disconnected.

That is, by applying an electrical signal to both ends of the first conductive pattern 120, resistance of the first region 120a increases to program the fuse structure 1.

Figure 6:
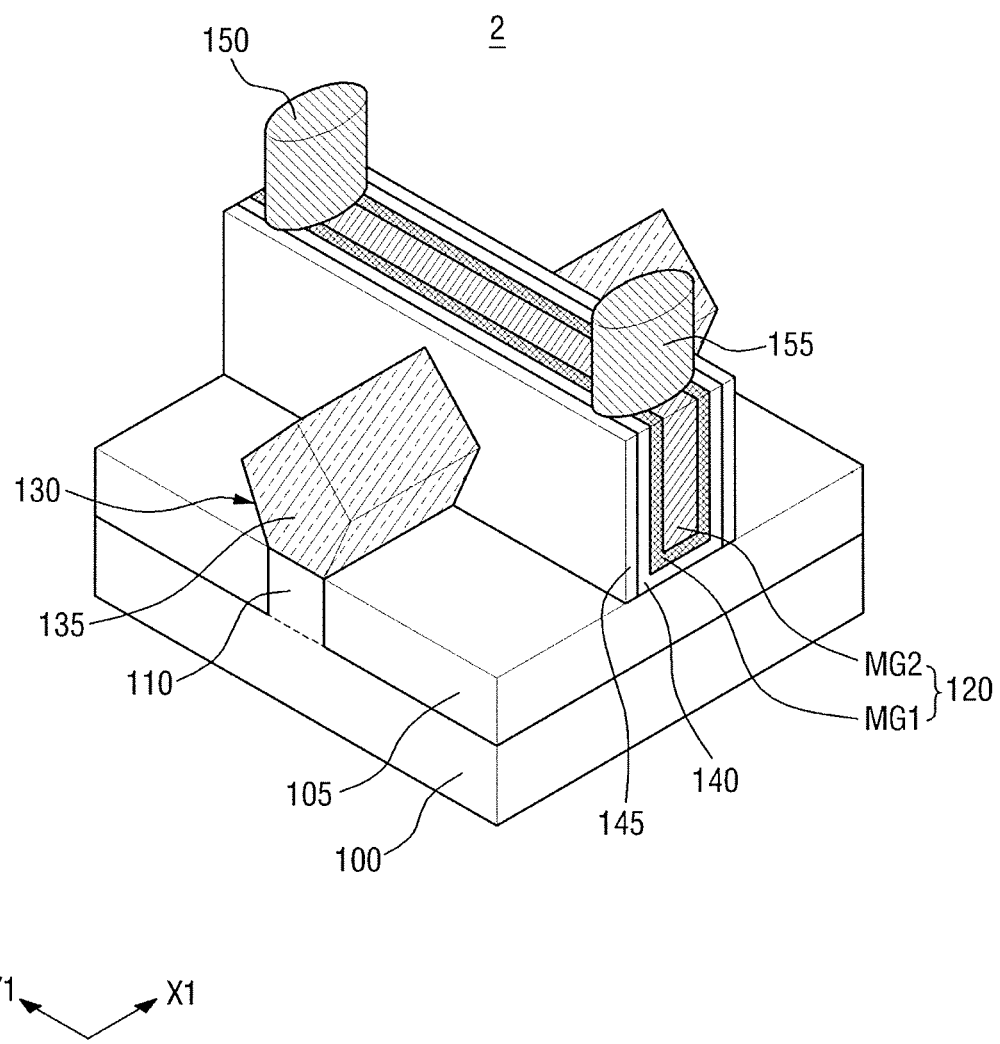
FIGS. 6 to 8 are views of a fuse structure according to another embodiment of the present disclosure.
Figure 7:
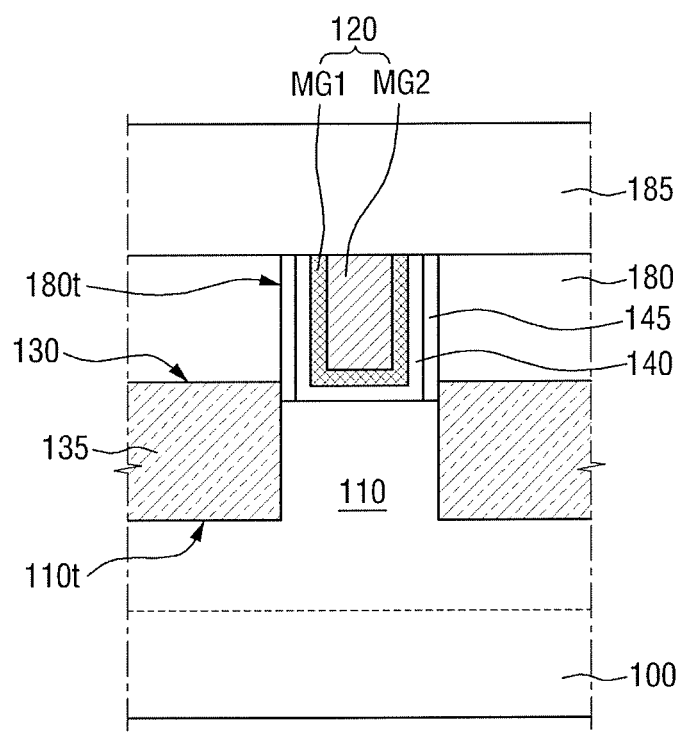
Figure 8:
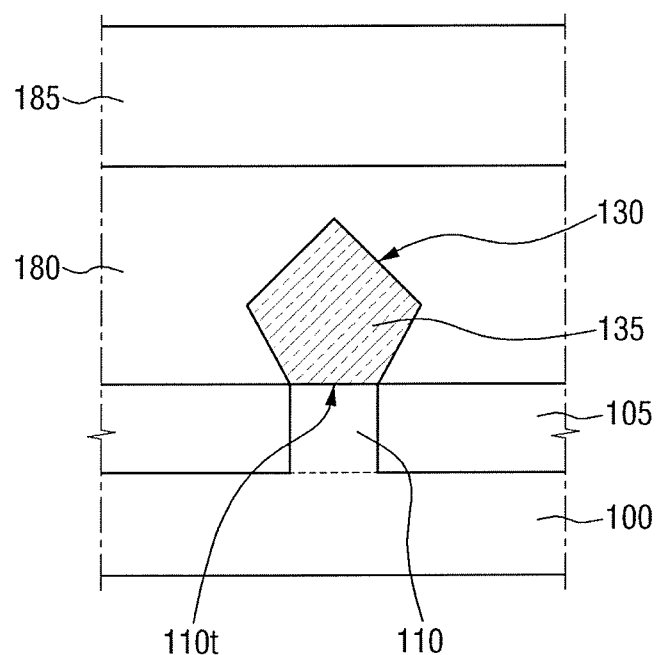

Referring to FIGS. 6 to 8, a fuse structure according to another embodiment of the present disclosure will be described. For convenience of explanation, duplicate descriptions with respect to FIGS. 1 to 5 will be simplified or omitted.

FIGS. 6 to 8 are views of a fuse structure according to another embodiment of the present disclosure. More specifically, FIG. 6 is a perspective view of a fuse structure according to another embodiment of the present disclosure. FIG. 7 is a cross-sectional view cut along line B-B of FIG. 1, illustrating a fuse structure according to another embodiment of the present disclosure. FIG. 8 is a cross-sectional view cut along line C-C of FIG. 1 that illustrates a fuse structure according to another embodiment of the present disclosure.

Referring to FIGS. 6 to 8, a fuse structure 2 according to another embodiment of the present disclosure further includes a second trench 110t and a first epitaxial layer 135.

The second trench 110t is disposed on each side of the first conducive pattern 120. The second trench 110t is disposed on the first fin pattern 110.

The first epitaxial layer 135 is disposed in the second trench 110t. That is, the first epitaxial layer 135 is disposed on each side of the first conductive pattern 120 on the first fin pattern 110. An upper surface of the first epitaxial layer 135 may project above an upper surface of the first fin pattern 110.

The first semiconductor region 130 includes the first epitaxial layer 135 disposed in the second trench 110t.

The cross section of the first epitaxial layer 135 may have various shapes. For example, the cross section of the first epitaxial layer 135 may have at least one of a pentagonal shape, a hexagonal shape, a circular shape, and a rectangular shape. FIGS. 6 to 8 exemplarily illustrate a pentagonal shape.

The first epitaxial layer 135 may include, for example, a compression stress material. For example, a compression stress material may have a lattice constant greater than the lattice constant of Si, and may be, for example, SiGe.

Further, the first epitaxial layer 135 may be made of the same material as the first fin pattern 110, or may include a tensile stress material. For example, if the first fin pattern 110 is made of Si, the first epitaxial layer 135 may be made of Si or a material having a lattice constant less than the lattice constant of Si, such as SiC.

Referring to FIGS. 9 to 13, fuse structures according to further embodiments of the present disclosure will be described. For convenience of explanation, duplicate descriptions with respect to FIGS. 6 to 8 will be simplified or omitted.

Figure 9:
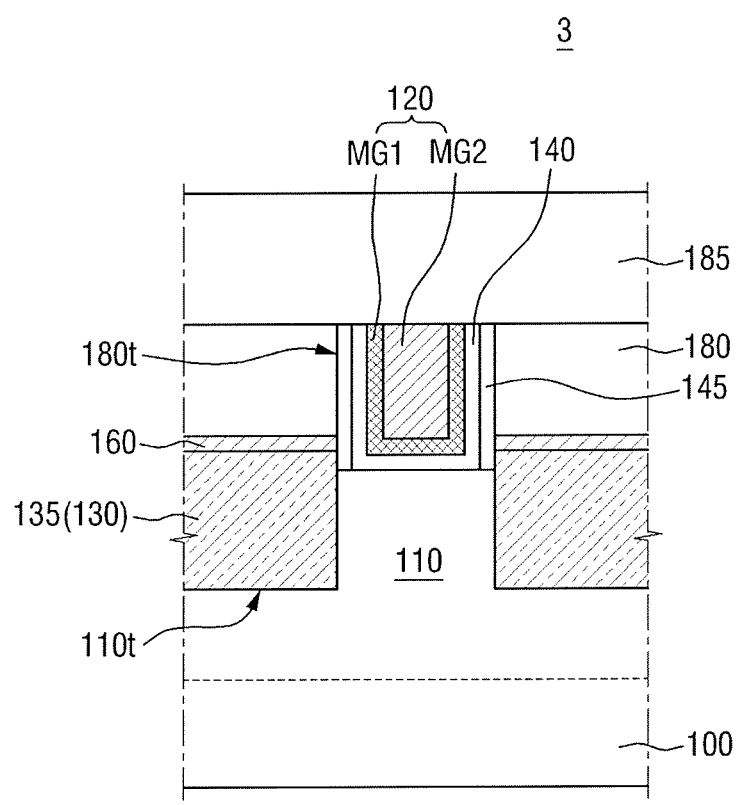
FIGS. 9 and 10 are views of a fuse structure according to another embodiment of the present disclosure.
Figure 10:
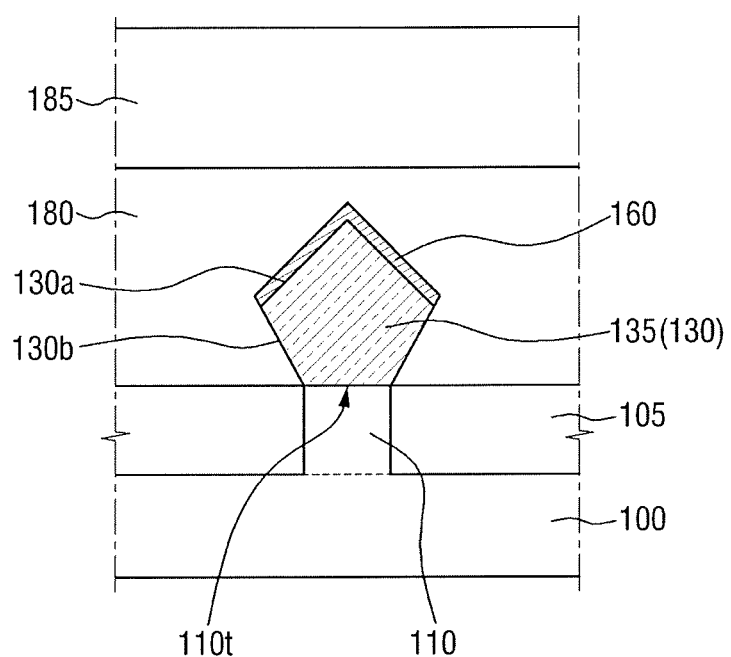
Figure 11:
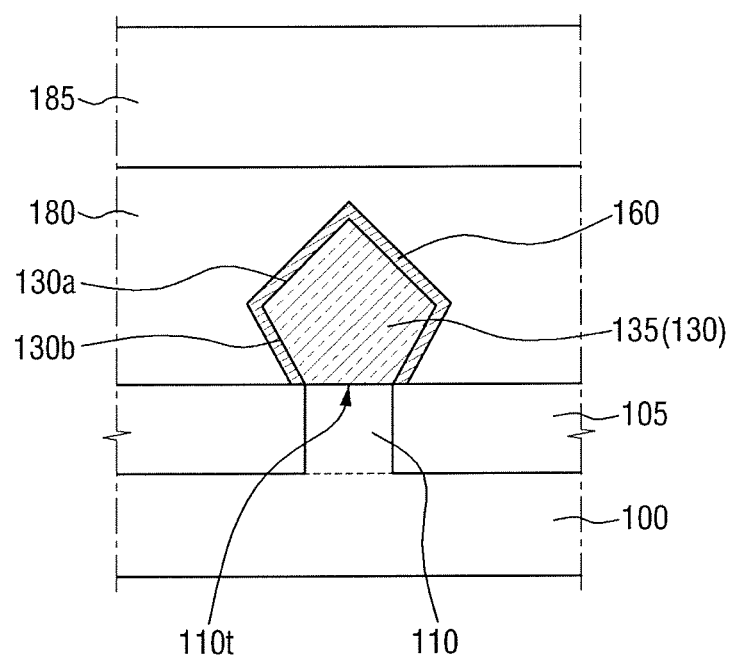
FIG. 11 is a view of a fuse structure according to another embodiment of the present disclosure.
Figure 12:
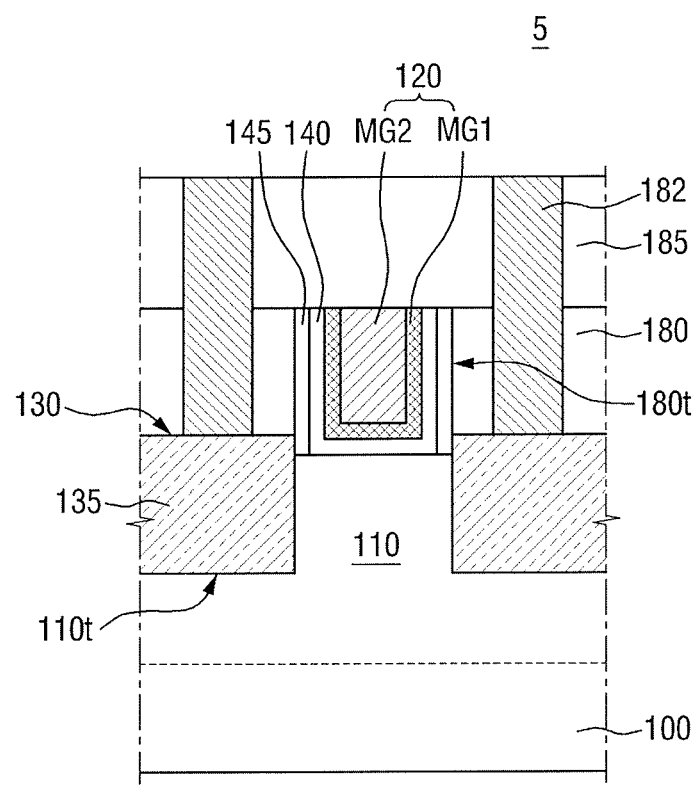
FIGS. 12 and 13 are views of a fuse structure according to another embodiment of the present disclosure.
Figure 13:
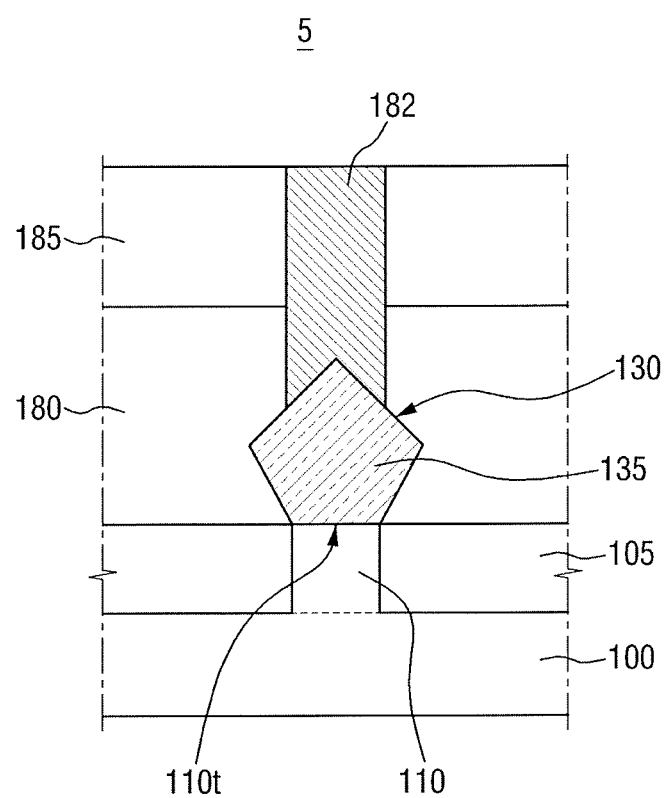

FIGS. 9 and 10 are views of a fuse structure according to another embodiment of the present disclosure, and FIG. 11 is a view of a fuse structure according to another embodiment of the present disclosure. FIGS. 12 and 13 are views of a fuse structure according to another embodiment of the present disclosure.

More specifically, FIG. 9 is a cross-sectional view cut along line B-B of FIG. 1, illustrating a fuse structure according to another embodiment of the present disclosure. FIG. 10 is a cross-sectional view cut along line C-C of FIG. 1, illustrating the fuse structure according to another embodiment of the present disclosure. FIG. 11 is a cross-sectional view cut along line C-C of FIG. 1, illustrating a fuse structure according to another embodiment of the present disclosure. FIG. 12 is a cross-sectional view cut along line B-B of FIG. 1, illustrating a fuse structure according to another embodiment of the present disclosure. FIG. 13 is a cross-sectional view cut along line C-C of FIG. 1, illustrating the fuse structure according to another embodiment of the present disclosure.

Referring to FIGS. 9 and 10, a fuse structure 3 according to another embodiment of the present disclosure may further include a first metal alloy layer 160.

The first semiconductor region 130, which includes the first epitaxial layer 135, may include a side wall 130b and an upper surface 130a as illustrated in FIG. 10. The side wall 130b of the first semiconductor region 130 may be a region connected to the first fin pattern 110. The side wall 130b of the first semiconductor region 130 is tilted inward according to the shape thereof, and may not be seen from an upper side.

The first metal alloy layer 160 may be disposed on the upper surface 130a of the first semiconductor region 130. No first metal alloy layer 160 may be disposed on the side wall 130b of the first semiconductor region 130.

FIG. 10 shows that the first metal alloy layer 160 covers the entire upper surface 130a of the first semiconductor region, but the first metal alloy layer 160 is not limited thereto.

The first metal alloy layer 160 may include, for example, silicide.

If the first metal alloy layer 160 is formed from a metal alloy layer used in a p-type transistor, the first metal alloy layer 160 may include, for example, at least one of Pt, Pd, NiB, and NiPt, but is not limited thereto.

Further, if the first metal alloy layer 160 is formed from a metal alloy layer used in an n-type transistor, the first metal alloy layer 160 may include, for example, at least one of Co, Cr, W, Mo, Ta, Er, and NiP, but is not limited thereto.

In addition, if the first metal alloy layer 160 is formed from a metal alloy layer used in the p-type transistor and a metal alloy layer used in the n-type transistor, the first metal alloy layer 160 may include, for example, NiSi or TiSi, but is not limited thereto.

Referring to FIG. 11, a fuse structure 4 according to another embodiment of the present disclosure may further include a first metal alloy layer 160.

The fuse structure 4 according to another embodiment of the present disclosure differs from the fuse structure 3 of FIGS. 9 and 10 in that the first metal alloy layer 160 is disposed on the upper surface 130a of the first semiconductor region 130 and the side wall 130b of the first semiconductor region 130.

In other words, the first metal alloy layer 160 may cover the whole perimeter of the first semiconductor region 130, which projects over the upper surface of the field insulating layer 105. Even if the side wall 130b of the first semiconductor region 130 is tilted, the first metal alloy layer 160 may be disposed on the side wall 130b of the first semiconductor region.

Referring to FIGS. 12 and 13, a fuse structure 5 according to a fifth embodiment of the present disclosure may further include a third contact 182.

The third contact 182 may be disposed on the first semiconductor region 130. The third contact 182 may be disposed on each side of the first conductive pattern 120, but is not limited thereto. The third contact 182 may be connected to the first semiconductor region 130.

However, no wirings are electrically connected to the third contact 182. That is, the third contact 182 does not apply an electrical signal to the first semiconductor region 130. Accordingly, the first semiconductor region 130 is electrically floated.

The third contact 182 may include, for example, Al, Cu, and W, but is not limited thereto.

Referring to FIGS. 14 to 17, a fuse structure according to another embodiment of the present disclosure will be described. For convenience in explanation, duplicate descriptions with respect to FIGS. 1 to 5 will be simplified or omitted.

Figure 14:
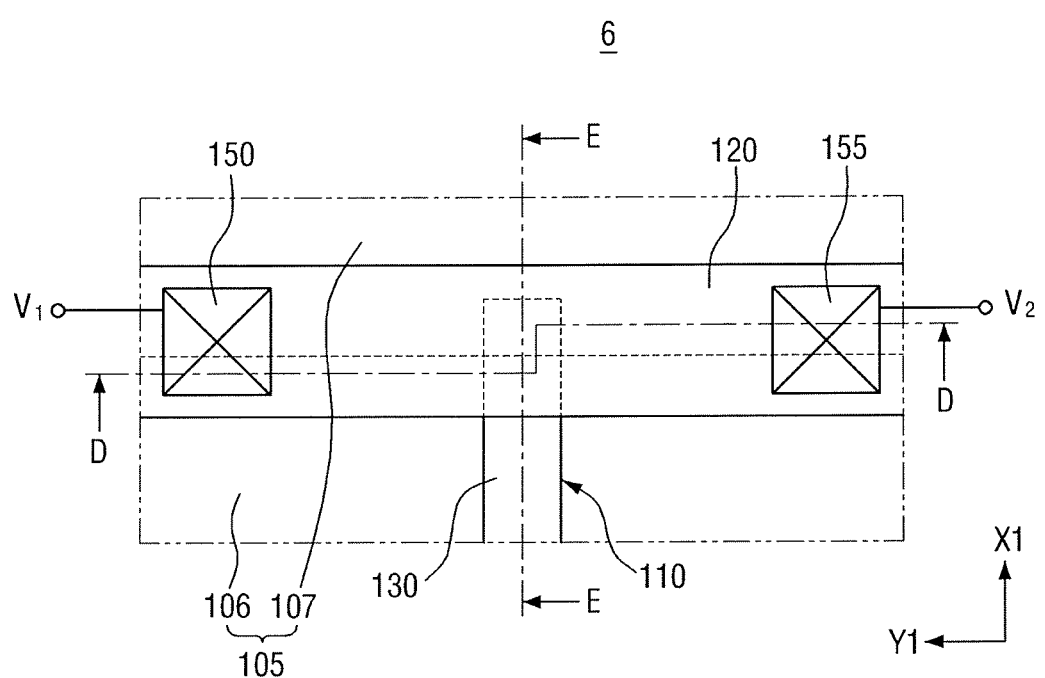
FIGS. 14 and 15 are a layout diagram and a perspective view of a fuse structure according to another embodiment of the present disclosure.
Figure 15:
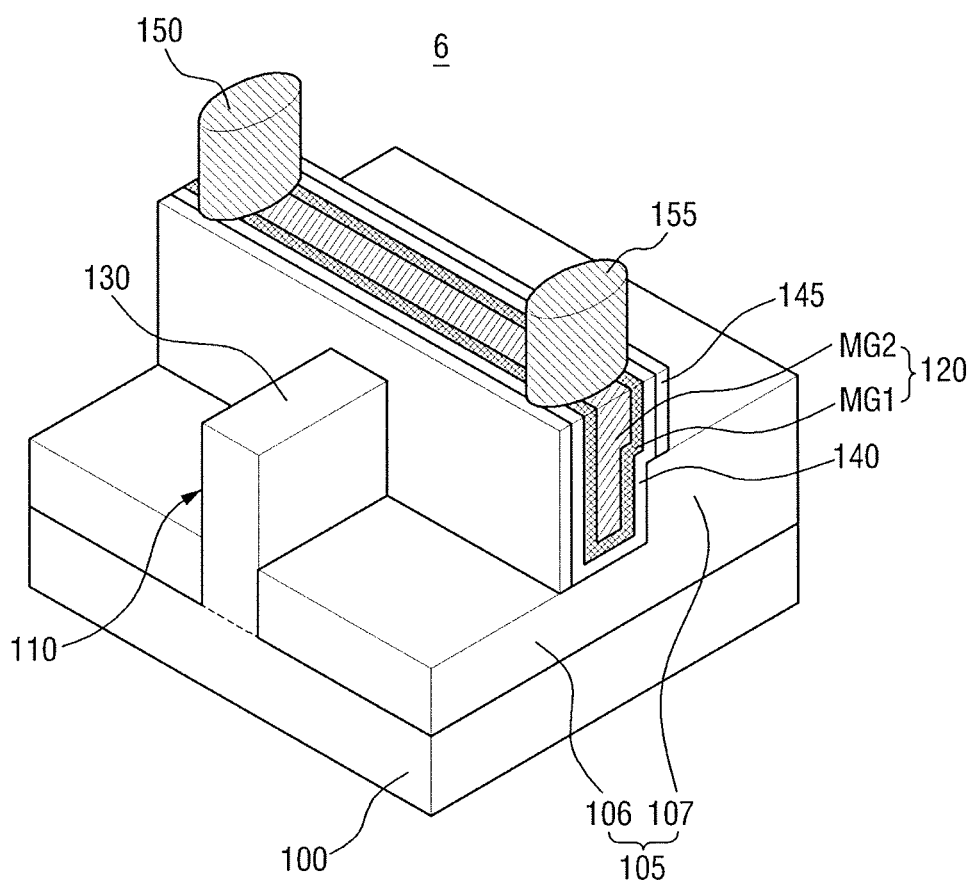
Figure 16:
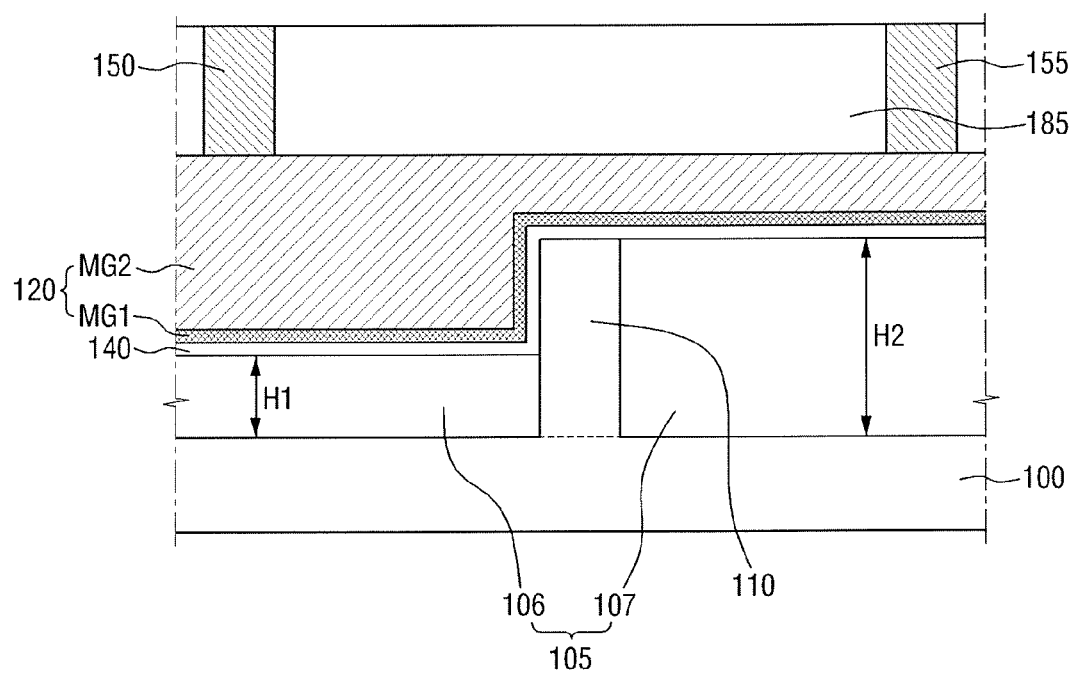
FIG. 16 is a cross-sectional view cut along line D-D of FIG. 14.
Figure 17:
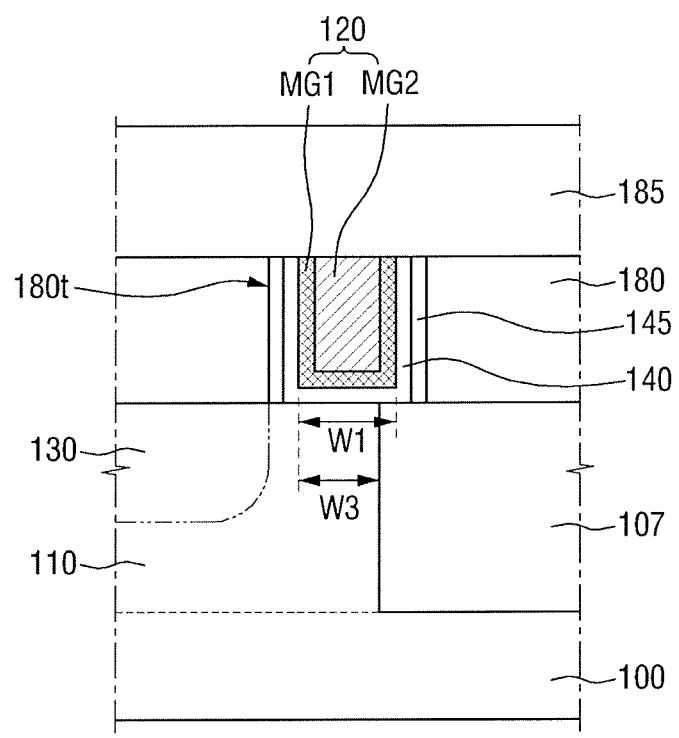
FIG. 17 is a cross-section view cut along line E-E of FIG. 14.

FIGS. 14 and 15 are a layout diagram and a perspective view, respectively, of a fuse structure according to another embodiment of the present disclosure. FIG. 16 is a cross-sectional view cut along line D-D of FIG. 14, and FIG. 17 is a cross-section view cut along line E-E of FIG. 14.

Referring to FIGS. 14 to 17, in a fuse structure 6 according to another embodiment of the present disclosure, the field insulating layer 105 may include a first region 106 and a second region 107.

The first fin pattern 110 is disposed in the first region 106 of the field insulating layer but not the second region 107 of the field insulating layer. Since the first fin pattern 110 extends in the first direction X1, the first fin pattern 110 has a long side parallel to the first direction X1 and a short side parallel to the second direction Y1.

In the drawing, the first fin pattern 110 has a cuboidal shape, but is not limited thereto. That is, the first fin pattern 110 may be chamfered. That is, corners of the first fin pattern 110 may be rounded. However, even if corner portions of the first fin pattern 110 are rounded, it is apparent to those skilled in the art to discriminate between the long side and the short side.

Specifically, the first region 106 of the field insulating layer may be in contact with the long side of the first fin pattern 110. The second region 107 of the field insulating layer may be in contact with the short side of the first fin pattern 110.

In other words, the first region 106 of the field insulating layer may extend in the first direction X1. The second region 107 of the filed insulating layer may extend in the second direction Y1.

Let the height of the first region 106 of the field insulating layer be a first height H1, and the height of the second region 107 of the field insulating layer be a second height H2. In a fuse structure according to another embodiment of the present disclosure, the height H2 of the second region 107 is greater than the height H1 of the first region 106.

Further, as illustrated in FIG. 14, the field insulating layer 105 may surround the vertical end of the first fin pattern 110.

The second region 107 of the field insulating layer 105 may surround the vertical end of the first fin pattern 110, but is not limited thereto.

As illustrated in FIGS. 16 and 17, the upper surface of the second region 107 and the upper surface of the first fin pattern 110 may be coplanar, but they are not limited thereto. The upper surface of the second region 107 may be higher than the upper surface of the first fin pattern 110.

Referring to FIGS. 16 and 17, the height H2 of the second region 107 is shown as being equal to the height of the first fin pattern 110, but the heights are not limited thereto.

Further, the first region 106 and the second region 107 are shown as having an integral structure, but the regions are not limited thereto. That is, the first region 106 and the second region 107 may be formed by different processes. Further, the first region 106 and the second region 107 may include different materials.

At least a part of the first conductive pattern 120 crosses the first fin pattern 110. Further, a part of the first conductive pattern 120 may be disposed on the second region 107 of the field insulating layer. That is, the first conductive pattern 120 may include a portion on the first region 106 of the field insulating layer and a portion on the second region 107 of the field insulating layer.

As illustrated in FIG. 17, the width W1 of the first conductive pattern 120 in the first direction X1 may be greater than the width W3 of the overlap region of the first fin pattern 110 and the first conductive pattern 120, but the widths are not limited thereto.

That is, the width W1 of the first conductive pattern 120 may be equal to the width W3 of the overlap region of the first fin pattern 110 and the first conductive pattern 120. In this case, the fuse spacer 145 that is disposed on one side of the first conductive pattern 120 may be disposed on the second region 107 of the field insulating layer.

As illustrated in the drawing, the first semiconductor region 130 may be positioned on one side of the first conductive pattern 120. Further, the second region 107 may be positioned on the other side of the first conductive pattern 120.

In a fuse structure according to another embodiment of the present disclosure, the first conductive pattern 120 includes a portion that crosses the first fin pattern 110 between the first contact 150 and the second contact 155. In the portion of the first conductive pattern 120 that crosses the first fin pattern 110, current density abruptly increases. Accordingly, by applying an electrical signal to both ends of the first conductive pattern 120, the fuse structure 6 can be programmed.

Referring to FIGS. 18 to 21, a semiconductor device according to further embodiments of the present disclosure will be described. For convenience of explanation, duplicate descriptions with respect to FIGS. 6 to 8 will be simplified or omitted.

Figure 18:
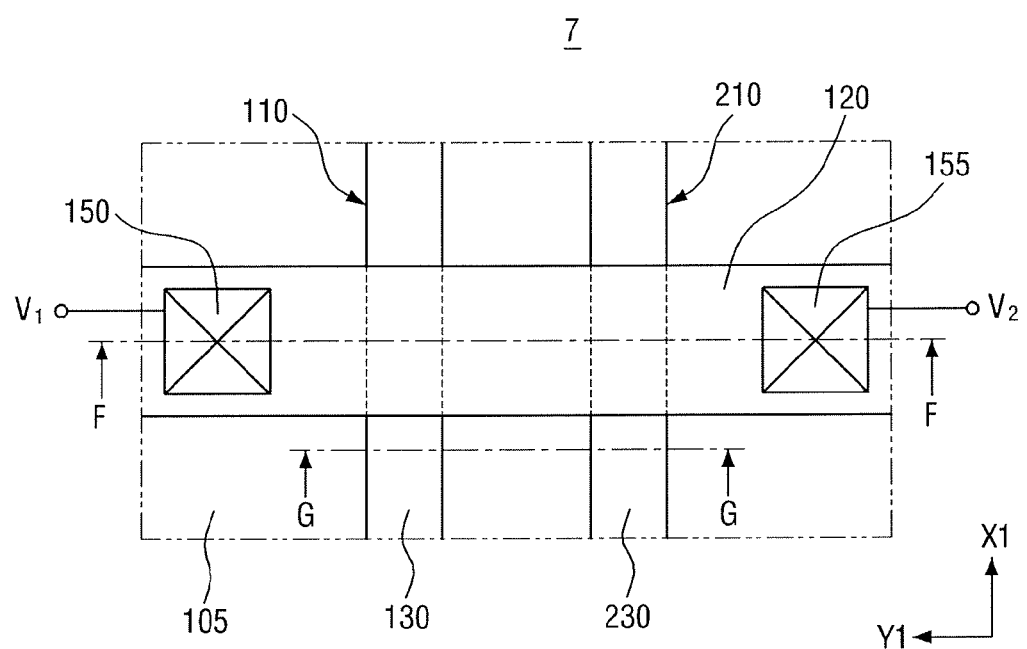
FIGS. 18 to 20 are views of a fuse structure according to another embodiment of the present disclosure.
Figure 19:
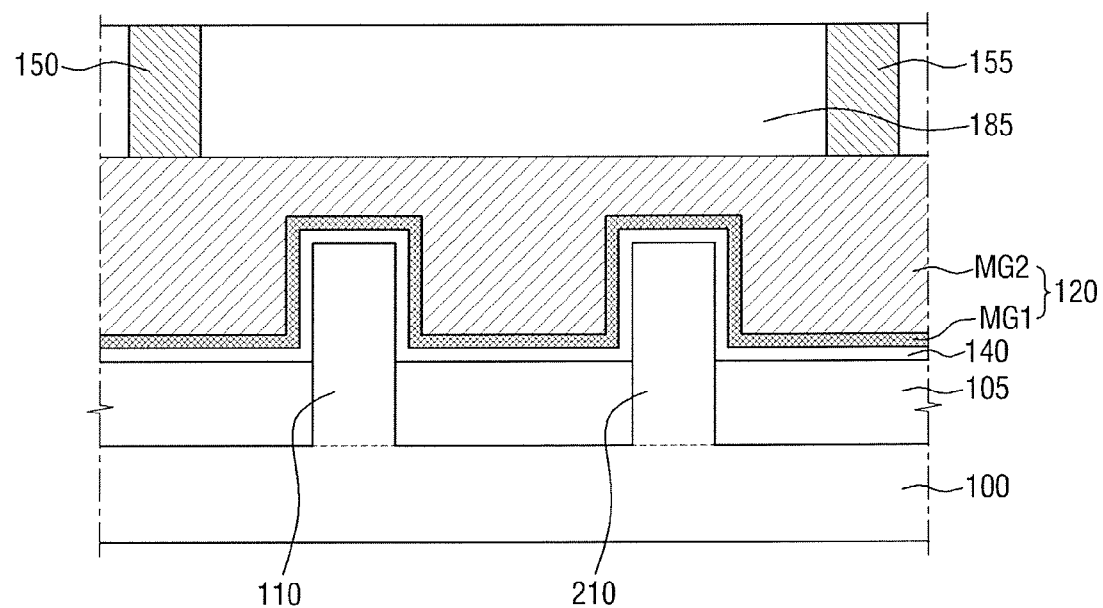
Figure 20:
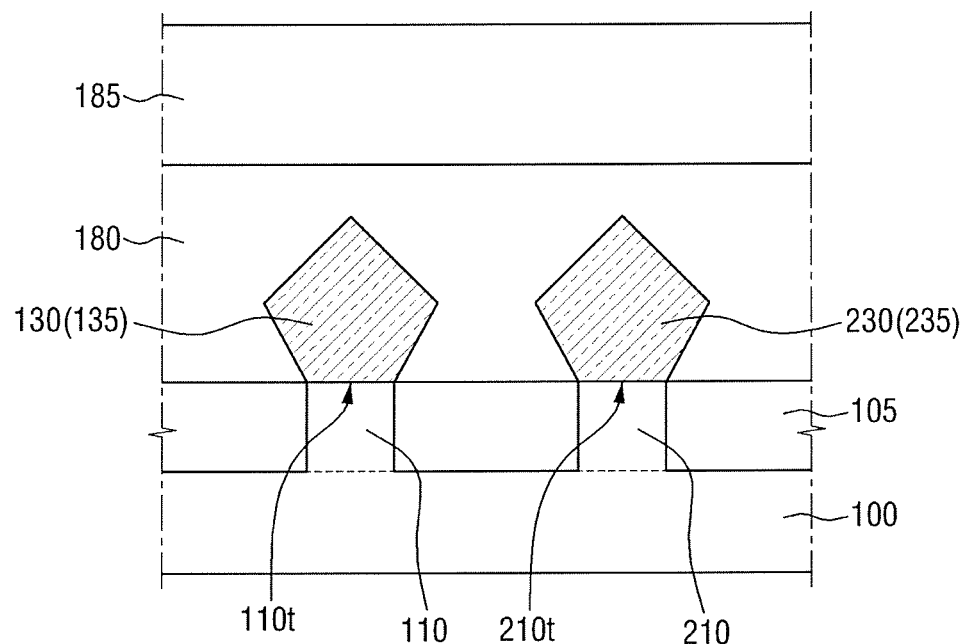
Figure 21:
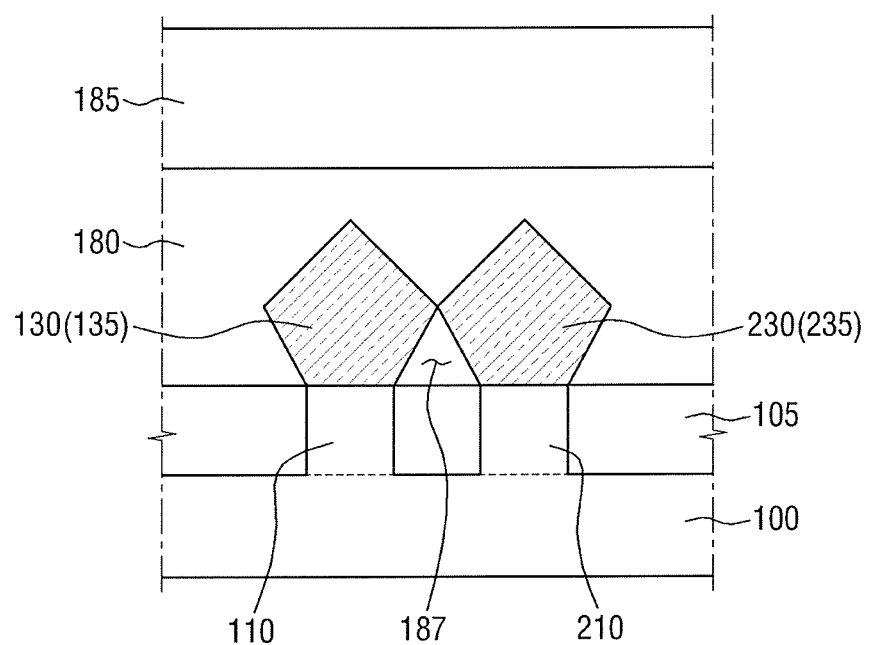
FIG. 21 is a view of a fuse structure according to another embodiment of the present disclosure.

FIGS. 18 to 20 are views of a fuse structure according to another embodiment of the present disclosure, and FIG. 21 is a view of a fuse structure according to another embodiment of the present disclosure. Specifically, FIG. 18 is a layout diagram of a fuse structure according to another embodiment of the present disclosure. FIG. 19 is a cross-sectional view cut along line F-F of FIG. 18, and FIG. 20 is a cross-sectional view cut along line G-G of FIG. 18. FIG. 21 is a cross-sectional view cut along line G-G, illustrating the fuse structure according to another embodiment of the present disclosure.

Referring to FIGS. 18 to 20, in a fuse structure 7 according to another embodiment of the present disclosure, the first fin pattern 110 and a second fin pattern 210 may extend along the first direction X1 on the substrate 100.

The field insulating layer 105 may be interposed between the first fin pattern 110 and the second fin pattern 210. The long side of the first fin pattern 110 and the long side of the second fin pattern 210 may face each other.

The first fin pattern 110 and the second fin pattern 210 include upper surfaces that project above the upper surface of the field insulting layer 105. The second fin pattern 210 is defined by the field insulating layer 105 in the same manner as the first fin pattern 110 in that the second fin pattern 210 projects up from the field insulating layer 105.

The first conductive pattern 120 may extend in the second direction Y1 and cross the first fin pattern 110 and the second fin pattern 210. The first conductive pattern 120 may be disposed on the first fin pattern 110, the second fin pattern 210, and the field insulating layer 105.

A second semiconductor region 230 may be positioned on at least one side of the first conductive pattern 120. For convenience in explanation, it may be assumed that the second semiconductor region 230 is positioned on each side of the first conductive pattern 120.

The second semiconductor region 230 may include a second epitaxial layer 235. The second epitaxial layer may be disposed in a third trench 210t that is disposed on the second fin pattern 210. The cross section of the second epitaxial layer 235 may have various shapes. For example, the cross section of the second epitaxial layer 235 may have at least one of a pentagonal shape, a hexagonal shape, a circular shape, and a rectangular shape. FIG. 20 exemplarily illustrates a pentagonal shape.

The second epitaxial layer 235 may be formed by the same process as the first epitaxial layer 135. The second epitaxial layer 235 may include the same material as the material of the first epitaxial layer 135.

In the same manner as the first semiconductor region 130, the second semiconductor region 230 is electrically floated. That is, no electrical signal is applied to the second semiconductor region 230. Accordingly, electrons or holes do not flow between the second semiconductor regions 230 positioned on each side of the first conductive pattern 120.

Referring to FIG. 18, the second fin pattern 210 includes a first portion that crosses the first conductive pattern 120 and a second portion that extends in the first direction X1 on each side of the first portion. The first conductive pattern 120 may be positioned on the first portion of the second fin pattern 210, and the second semiconductor region 230 may be positioned on the second portion of the second fin pattern 210.

Since the second semiconductor region 230 is electrically floated and no electrons or holes flow between the second semiconductor regions 230, the first portion of the second fin pattern 210 is not used as a channel region.

The first contact 150 and the second contact 155 are disposed on regions of the first conductive pattern 120 that do not cross the first fin pattern 110 and the second fin pattern 210.

The first contact 150 and the second contact 155 are not positioned between the first fin pattern 110 and the second fin pattern 210, but are respectively spaced apart from the first fin pattern 110 and the second fin pattern 210 so that the first fin pattern 110 and the second fin pattern 210 are positioned between the first contact 150 and the second contact 155.

Referring to FIG. 21, in a fuse structure 8 according to another embodiment of the present disclosure, the first semiconductor region 130 and the second semiconductor region 230 may connect to come in contact with each other.

Since the first semiconductor region 130 and the second semiconductor region 230 are in contact with each other, the first interlayer insulating layer 180 may not be positioned between the first semiconductor region 130 and the second semiconductor region 230. That is, there may be an air gap 187 disposed between the first semiconductor region 130 and the second semiconductor region 230.

Figure 22:
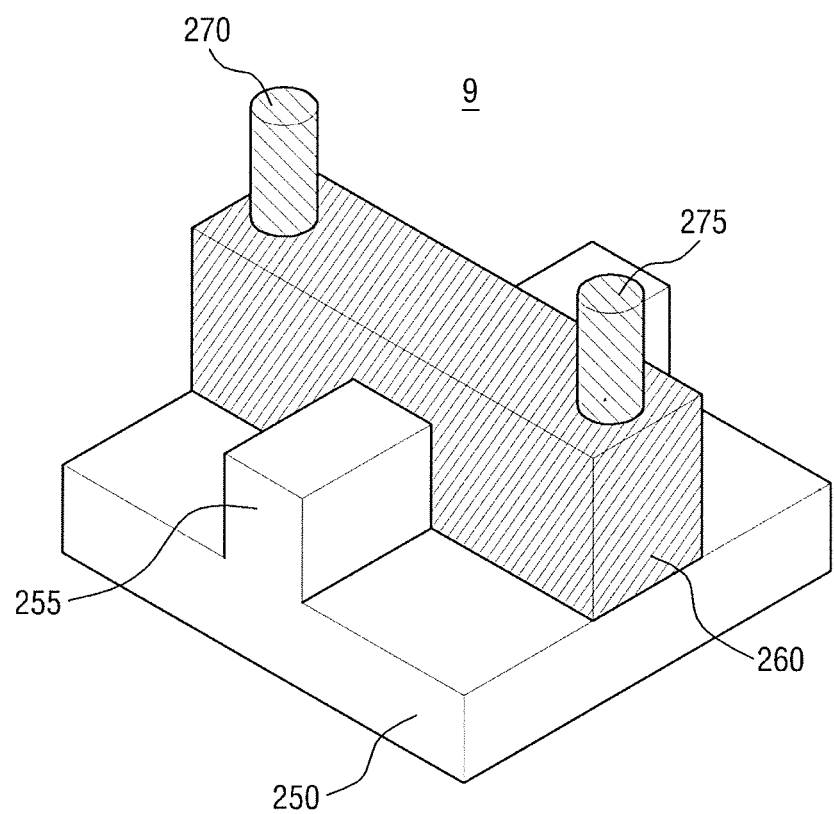
FIG. 22 is a view of a fuse structure according to another embodiment of the present disclosure.
Figure 23:
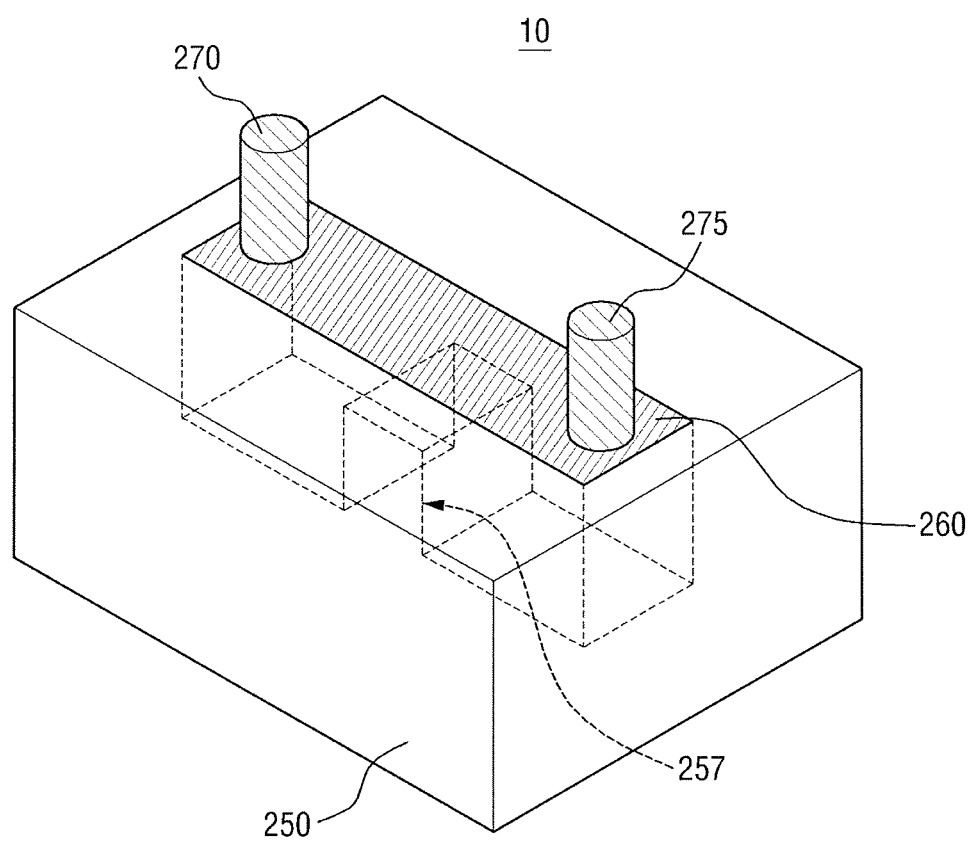
FIG. 23 is a view of a fuse structure according to another embodiment of the present disclosure.

Referring to FIGS. 22 and 23, a fuse structure according to further embodiments of the present disclosure will be described.

FIG. 22 is a view of a fuse structure according to another embodiment of the present disclosure, and FIG. 23 is a view explaining a fuse structure according to still another embodiment of the present disclosure.

Referring to FIG. 22, a fuse structure 9 according to another embodiment of the present disclosure may include a lower layer 250, a projection pattern 255, a second conductive pattern 260, a fourth contact 270, and a fifth contact 275.

The lower layer 250 may include, for example, an insulating material, and may include, for example, one of an oxide layer, a nitride layer, an oxynitride layer, and a combination thereof.

The projection pattern 255 projects up from an upper surface of the lower layer 250. The projection pattern 255 may be formed by patterning the lower layer 250 and may have an integrated structure with the lower layer 250, but is not limited thereto. That is, the lower layer 250 and the projection pattern 255 may be formed by separate processes.

The projection pattern 255 may extend in a third direction X2.

The second conductive pattern 260 may be disposed on the lower layer 250 and cross the projection pattern 255. The second conductive pattern 260 may extend in a fourth direction Y2. The second conductive pattern 260 includes a first region that crosses the projection pattern 255 and a second region that does not cross the projection pattern 255.

In the fuse structure 9 according to another embodiment of the present disclosure, the width of the region of the second conductive pattern 260 that crosses the projection pattern 255 may be equal to the width of the region of the second conductive pattern 260 that does not cross the projection pattern 255.

In the fuse structure 9 according to another embodiment of the present disclosure, the thickness of the region of the second conductive pattern 260 that crosses the projection pattern 255 is less than the thickness of the region of the second conductive pattern 260 that does not cross the projection pattern 255. That is, like the first conductive pattern 120 as described above with reference to FIG. 3, the second conductive pattern 260 may be thinner in the region that crosses the projection pattern 255.

In the fuse structure 9 according to another embodiment of the present disclosure, the upper surface of the second conductive pattern 260 may be substantially parallel to the upper surface of the lower layer 250.

FIG. 22 shows that the projection pattern 255 includes portions that project from each side of the second conductive pattern 260 that extend in the third direction X2, but the projection patterns are not limited thereto. The width of the projection pattern 255 in the fourth direction Y2 may be substantially equal to the width of the second conductive pattern 260 in the third direction X2.

The second conductive pattern 260 may include tungsten (W), aluminum (Al), copper (Cu), or a copper alloy. The copper alloy may include a very small amount of C, Ag, Co, Ta, In, Sn, Zn, Mn, Ti, Mg, Cr, Ge, Sr, Pt, Mg, Al, or Zr. Further, the second conductive pattern 260 may be made of a non-metal such as Si or SiGe.

The fourth contact 270 and the fifth contact 275 are disposed on the second conductive pattern 260. The fourth contact 270 and the fifth contact 275 are disposed on each side of the projection pattern 255 and are spaced apart therefrom in the fourth direction Y2. That is, the fourth contact 270 and the fifth contact 275 are disposed on regions of the second conductive pattern 260 that do not cross the projection pattern 255.

The fourth contact 270 and the fifth contact 275 may include, for example, Al, Cu, or W, but they are not limited thereto.

The fuse structure 9 according to another embodiment of the present disclosure may be manufactured not only in a FEOL (Front End Of Line) process but also in a BEOL (Back End Of Line) process.

Referring to FIG. 23, in a fuse structure 10 according to another embodiment of the present disclosure, the second conductive pattern 260 is disposed in the lower layer 250.

The projection pattern 257 is disposed in the lower layer 250. However, the upper surface of the projection pattern 257 does not project above the upper surface of the lower layer 250.

The fuse structure 10 according to another embodiment of the present disclosure may be substantially the same as the fuse structure 9 of FIG. 22 except that the fuse structure 10 is formed through a damascene process.

Referring to FIGS. 24 to 28, a semiconductor device according to another embodiment of the present disclosure will be described. For convenience in explanation, duplicate descriptions with respect to FIGS. 1 to 5 will be simplified or omitted.

Figure 24:
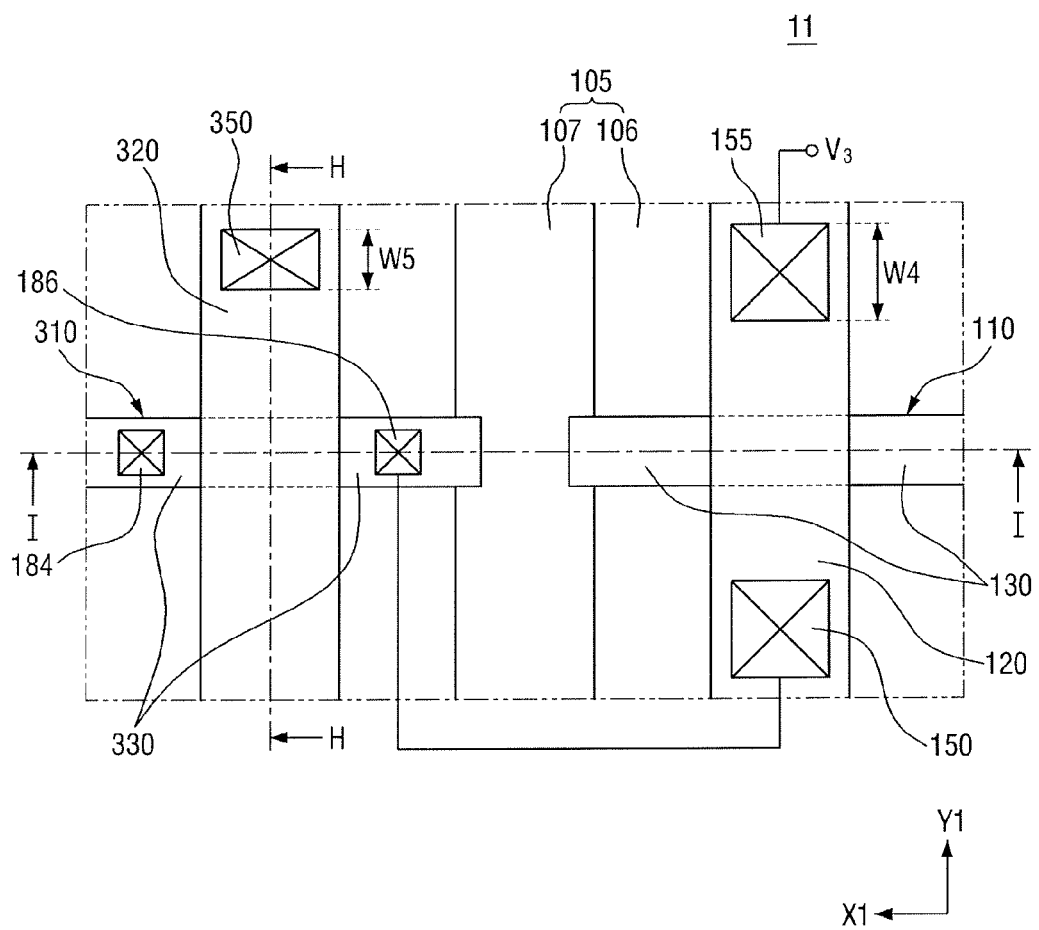
FIG. 24 is a layout diagram of a semiconductor device according to another embodiment of the present disclosure.
Figure 25:
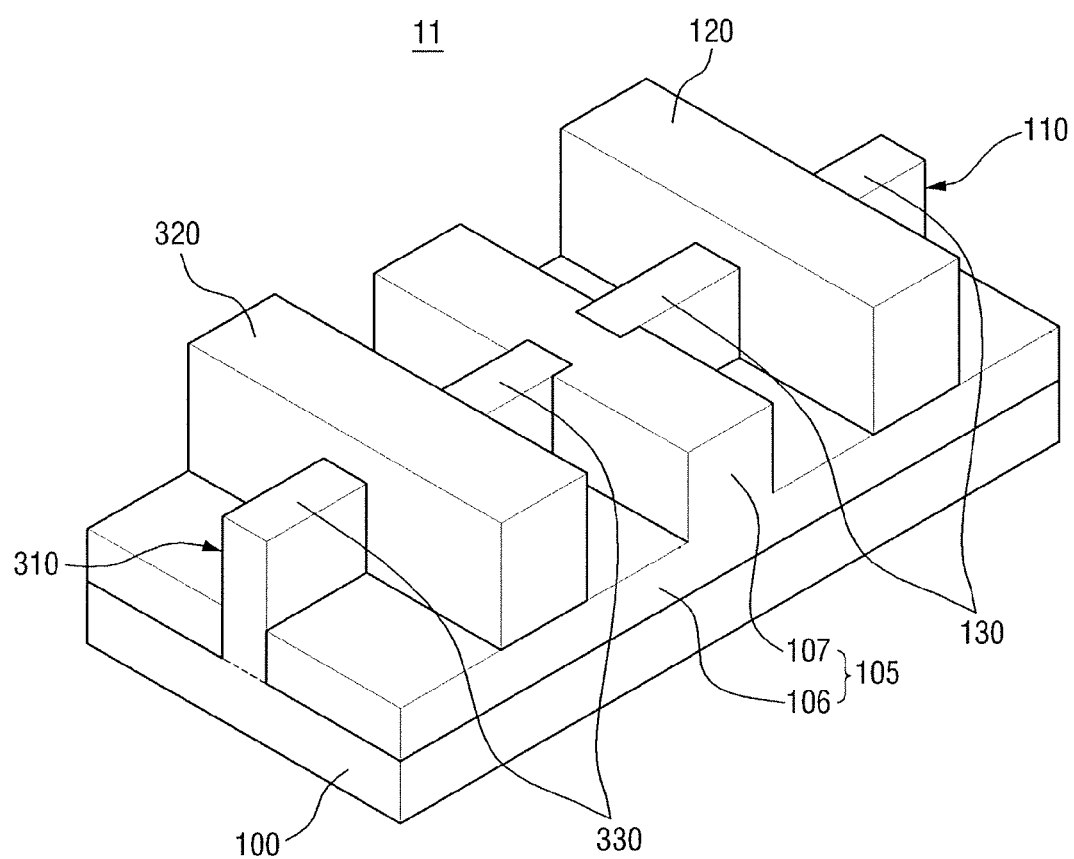
FIG. 25 is a perspective view of the semiconductor device according to FIG. 24.
Figure 25:
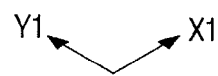
Figure 26:
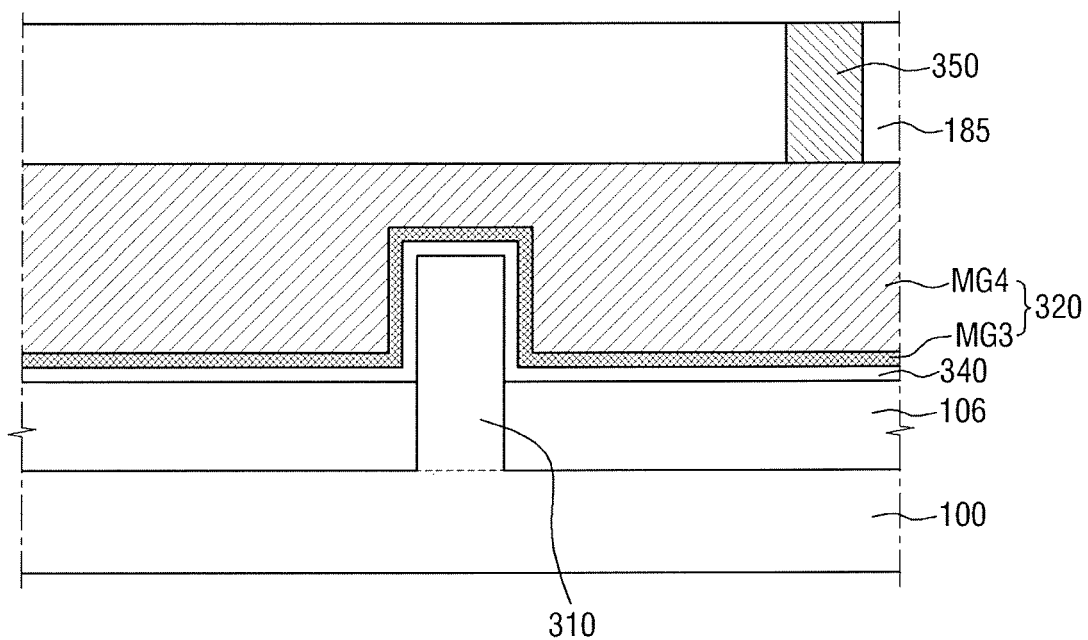
FIG. 26 is a cross-sectional view cut along line H-H of FIG. 24.
Figure 27:
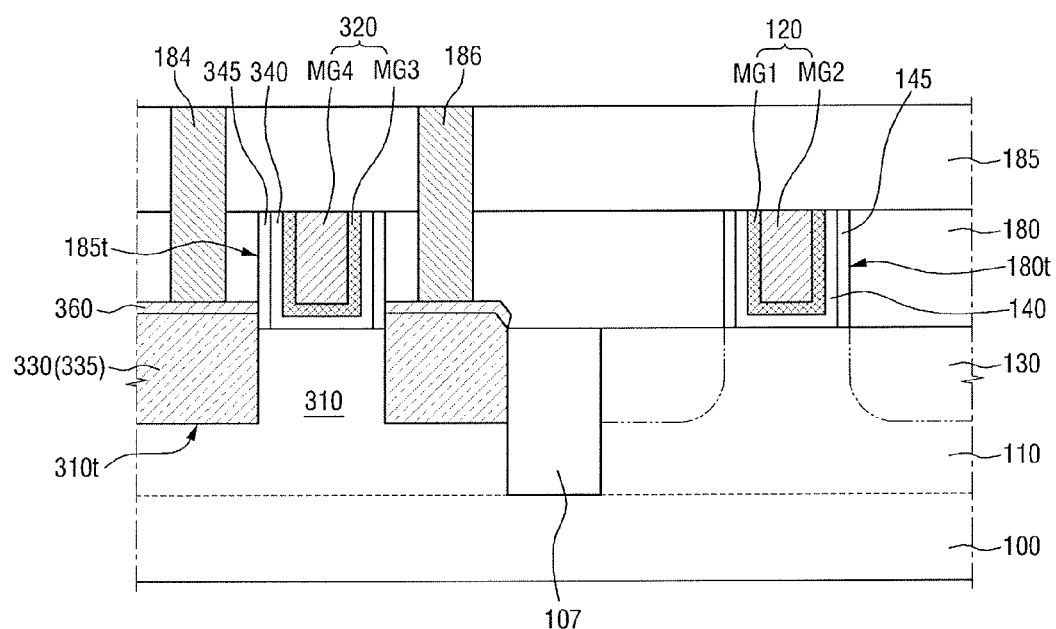
FIG. 27 is a cross-sectional view cut along line I-I of FIG. 24.
Figure 28:
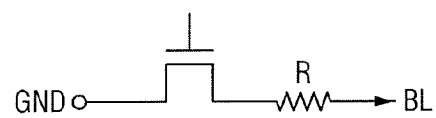
FIG. 28 is an equivalent circuit diagram of the semiconductor device according to FIG. 24.

FIG. 24 is a layout diagram of a semiconductor device according to another embodiment of the present disclosure. FIG. 25 is a perspective view of a semiconductor device according to FIG. 24 of the present disclosure, FIG. 26 is a cross-sectional view cut along line H-H of FIG. 24, and FIG. 27 is a cross-sectional view cut along line I-I of FIG. 24. FIG. 28 is an equivalent circuit diagram of a semiconductor device according to FIG. 24 of the present disclosure.

Referring to FIGS. 24 to 27, a semiconductor device 11 according to another embodiment of the present disclosure may include a first fin pattern 110, a third fin pattern 310, a first conductive pattern 120, a gate electrode 320, a first semiconductor region 130, a source/drain 330, a first contact 150, and a second contact 155.

The first fin pattern 110 and the third fin pattern 310 may project from the substrate 100. The first fin pattern 110 and the third fin pattern 310 are respectively defined by a first region 106 and a second region 107 of a field insulating layer 105 as follows.

Since the first region 106 of the field insulating layer 105 covers parts of side surfaces of the first fin pattern 110 and the third fin pattern 310, the upper surface of the first fin pattern 110 and the upper surface of the third fin pattern 310 may project above the upper surface of the first region 106.

The first fin pattern 110 and the third fin pattern 310 extend in the first direction X1. The first fin pattern 110 and the third fin pattern 310 may be collinear with each other.

Since the first fin pattern 110 and the third fin pattern 310 extend in the first direction X1, the first fin pattern 110 and the third fin pattern 310 may each include a long side parallel to the first direction X1 and a short side parallel to the second direction Y1.

As illustrated in the drawing, the short side of the first fin pattern 110 and the short side of the third fin pattern 310 face each other.

The first region 106 of the field insulating layer 105 may be in contact with the long side of the first fin pattern 110 and the long side of the third fin pattern 310. The second region 107 of the field insulating layer 105 may be in contact with the short side of the first fin pattern 110 and the short side of the third fin pattern 310.

Since the first region 106 is in contact with the long side of the first fin pattern 110 and the long side of the third fin pattern 310, the first region 106 may extend in the first direction X1. Since the short side of the first fin pattern 110 and the short side of the third fin pattern 310 face each other, the second region 107 is positioned between the first fin pattern 110 and the third fin pattern 310.

The height of the second region 107 may be higher than the height of the first region 106.

FIG. 25 shows that the upper surface of the second region 107 is coplanar with the upper surface of the first fin pattern 110 and the upper surface of the third fin pattern 310. However, this is merely for convenience of explanation, and a height of the upper surface of the second region 107 is not limited thereto.

As illustrated, the second region 107 of the field insulating layer 105 surrounds the vertical end of the first fin pattern 110 and the vertical end of the third fin pattern 310, but is not limited thereto.

As illustrated, the first and second regions 106, 107 of the field insulating layer 105 may have an integral structure, but they are not limited thereto.

The gate electrode 320 may be disposed on the first region 106 and the third fin pattern 310. The gate electrode 320 is disposed in the first interlayer insulating layer 180, and is disposed in a fourth trench 185t that extends in the second direction Y1. That is, the gate electrode 320 may extend in the second direction Y1. The gate electrode 320 may cross the third fin pattern 310.

The gate electrode 320 may include metal layers MG3 and MG4. As illustrated, the gate electrode 320 may be formed by stacking two or more metal layers MG3 and MG4. The third metal layer MG3 may adjust a work function, and the fourth metal layer MG4 may fill a space defined by the third metal layer MG3. For example, the third metal layer MG3 may include, at least one of TiN, TaN, TiC, and TaC. Further, the fourth metal layer MG4 may include W or Al. Further, the gate electrode 320 may be made of a non-metal such as Si or SiGe. The gate electrode 320 as described above may be formed by a replacement process, but its fabrication processes are not limited thereto.

A gate insulating layer 340 may be disposed between the third fin pattern 310 and the gate electrode 320, and on side walls of the gate electrode 320. The gate insulating layer 340 may be disposed on an upper surface and a side surface of the third fin pattern 310 that projects above the first region 106 of the field insulating layer 105. Further, the gate insulating layer 340 may be arranged between the gate electrode 320 and the first region 106 of the field insulating layer 105. The gate insulating layer 340 as described above may include a high-k material with dielectric constant that is greater than the dielectric constant of the silicon oxide layer. For example, the gate insulating layer 340 may include, but is not limited to, at least one of hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate.

A gate spacer 345 may be disposed on a side wall of the gate insulating layer 340 parallel to the gate electrode 320. The gate spacer 345 may include at least one of silicon nitride (SiN), silicon oxynitride (SiON), silicon oxide ($SiO_2$), silicon oxide carbon nitride (SiOCN), and a combination thereof.

The source/drain 330 is disposed on each side of the gate electrode 320. The source/drain 330 may include a third epitaxial layer 335. The third epitaxial layer 335 may be disposed in a fifth trench 310t in the third fin pattern 310.

In the semiconductor device 11 according to another embodiment of the present disclosure, if a transistor that includes the gate electrode 320 is a PMOS transistor, the third epitaxial layer 335 may include a compression stress material. For example, the compression stress material may have a lattice constant that is greater than the lattice constant of Si, and may be, for example, SiGe. The compression stress material may apply a compression stress to the third fin pattern 310, for example, a portion where the gate electrode 320 overlaps the third fin pattern 310, to improve mobility.

On the other hand, in the semiconductor device 11 according to another embodiment of the present disclosure, if the transistor that includes the gate electrode 320 is an NMOS transistor, the third epitaxial layer 335 may include the same material as the third fin pattern 310 or a tensile stress material. For example, if the third fin pattern 310 is made of Si, the third epitaxial layer 335 may be made of Si or of a material having a lattice constant that is less than the lattice constant of Si, such as SiC.

A second metal alloy layer 360 may be disposed on at least an upper surface of the source/drain 330. The second metal alloy layer 360 may include, for example, silicide.

If the transistor that includes the gate electrode 320 is a PMOS transistor, the second metal alloy layer 360 may include, for example, at least one of Pt, Pd, NiB, and NiPt, but is not limited thereto.

Further, if the transistor that includes the gate electrode 320 is an NMOS transistor, the second metal alloy layer 360 may include, for example, at least one of Co, Cr, W, Mo, Ta, Er, NiP, NiSi, and TiSi, but is not limited thereto.

A sixth contact 350 is disposed on the gate electrode 320. The sixth contact 350 may penetrate the second interlayer insulating layer 185, but is not limited thereto. The sixth contact 350 is electrically connected to the gate electrode 310. The sixth contact 350 can apply a voltage to the gate electrode. Different voltages are not simultaneously applied to the gate electrode 320.

A seventh contact 184 and an eighth contact 186 are disposed on the source/drain 330. The seventh contact 184 and the eighth contact 186 may penetrate the first interlayer insulating layer 180 and the second interlayer insulating layer 185, respectively, but are not limited thereto.

The seventh contact 184 and the eighth contact 186 electrically connect respective wirings to the source/drain 330. That is, the source/drain 330 on each side of the gate electrode 320 can transmit and receive electric signals through the wirings.

If a voltage is applied to the gate electrode 320 to form a channel region in the third fin pattern 310, and an electrical signal is applied to the seventh contact 184 and the eighth contact 186, electrons or holes flow between the source/drain 330.

The sixth contact 350, the seventh contact 184, and the eighth contact 186 may include, for example, Al, Cu, and W, but are not limited thereto.

The first conductive pattern 120 may be disposed on the first region 106 of the field insulating layer 105 and the first fin pattern 110. At least a part of the first conductive pattern 120 crosses the first fin pattern 110. The first conductive pattern 120 extends in the second direction Y1.

The width of the region where the first conductive pattern 120 overlaps the first fin pattern 110 may be equal to the width of the first conductive pattern 120 in the first direction X1.

Referring to FIGS. 3 and 25, the thickness t2 of the first conductive pattern 120 on the first region 106 is greater than the thickness t1 of the first conductive pattern 120 on the first fin pattern 110.

The first conductive pattern 120 and the gate electrode 320 may include the same material, but are not limited thereto. For example, the first conductive pattern 120 and the gate electrode 320 may have the same material and the same number of stacked layers.

The first semiconductor region 130 may be positioned adjacent to least one side surface of the first conductive pattern 120. As illustrated, the first semiconductor region 130 may be positioned on each side of the first conductive pattern 120.

The second region 107 of the field insulating layer 105 may be positioned between the first semiconductor region 130 and the source/drain 330.

Further, the first semiconductor region 130 may be a part of the first fin pattern 110. As described above with respect to a previous fuse structure, the first semiconductor region 130 is electrically floated.

FIG. 27 shows that no metal alloy layer 360 is disposed on the upper surface of the first semiconductor region 130, but is not limited thereto.

The first contact 150 and the second contact 155 are disposed on the first conductive pattern 120. The first contact 150 and the second contact 155 are disposed on each side of the first fin pattern 110. The first contact 150 and the second contact 155 are connected to different voltages.

One of the first contact 150 and the second contact 155 is electrically connected to the source/drain 330 on one side of the gate electrode 320. For example, the first contact 150 may be electrically connected to the eighth contact 186, which is electrically connected to the source/drain 330, on one side of the gate electrode 320. Further, the second contact 155 may be connected to a third voltage V3.

In the semiconductor device according to another embodiment of the present disclosure, the area of the sixth contact 350, which is electrically connected to the gate electrode 320, may be less than the area of each of the first contact 150 and the second contact 155, which are electrically connected to the first conductive pattern 120.

It may be assumed that the width of the first contact 150 and the second contact 155 in the first direction X1 is equal to the width of the sixth contact 350 in the first direction X1. Let the width of the first contact 150 and the second contact 155 in the second direction Y1 be a fourth width W4, and the width of the sixth contact 350 in the second direction Y1 be a fifth width W5. Then, the fourth width W4 of the first contact 150 and the second contact 155 in the second direction Y1 is greater than the fifth width W5 of the sixth contact 350 in the second direction Y1.

In other words, the area of the first contact 150 is greater than the area of the sixth contact 350, and the area of the second contact 155 is greater than the area of the sixth contact 350.

Although the widths of the first contact 150 and the second contact 155 in the second direction Y1 are described as being equal to each other, they are not limited thereto.

The reason why the area of the first contact 150 and the area of the second contact 155, which are electrically connected to the first conductive pattern 120, should be larger than the area of the sixth contact 350, which is electrically connected to the gate electrode 320, is as follows.

Even if an electrical signal is applied to the sixth contact 350 to form a channel region on the lower portion of the gate electrode 320, the current flow in the gate electrode is extremely low. That is, the amount of current that flows through the sixth contact 350 becomes extremely small.

However, when the first conductive pattern 120 is programmed by applying an electrical signal to the first contact 150 and the second contact 155, the current that flows through the first contact 150 and the second contact 155 becomes very high.

In other words, the amount of current that flows through the first contact 150 and the second contact 155 is much larger than the amount of current that flows through the sixth contact 350. Accordingly, to secure contact stability, the first contact 150 and the second contact 155 should have a larger size than the sixth contact 350.

Referring to FIGS. 24 to 28, the operation of the semiconductor device according to the eleventh embodiment of the present disclosure will be described.

In FIG. 28, a resistor R corresponds to the first conductive pattern 120, and the gate electrode 320 corresponds to the gate of the transistor. Further, the third voltage V3, which is connected to the second contact 155, may be connected to a bit line BL, and a seventh contact 184, which is not electrically connected to the first contact 150, may be connected to ground GND.

To program the portion that corresponds to the first conductive pattern 120, current should flow to the first conductive pattern 120. Accordingly, an operation voltage is applied to the gate electrode 320 to form a channel region. Further, a voltage that can program the first conductive pattern 120 is applied to the bit line BL. Through this, a current flows to the first conductive pattern 120, and the current density abruptly increases in the region of the first conductive pattern 120 that crosses the first fin pattern 110.

As the first conductive pattern 120 has an increased resistance, a fuse structure that includes the first conductive pattern 120 is programmed.

Figure 29:
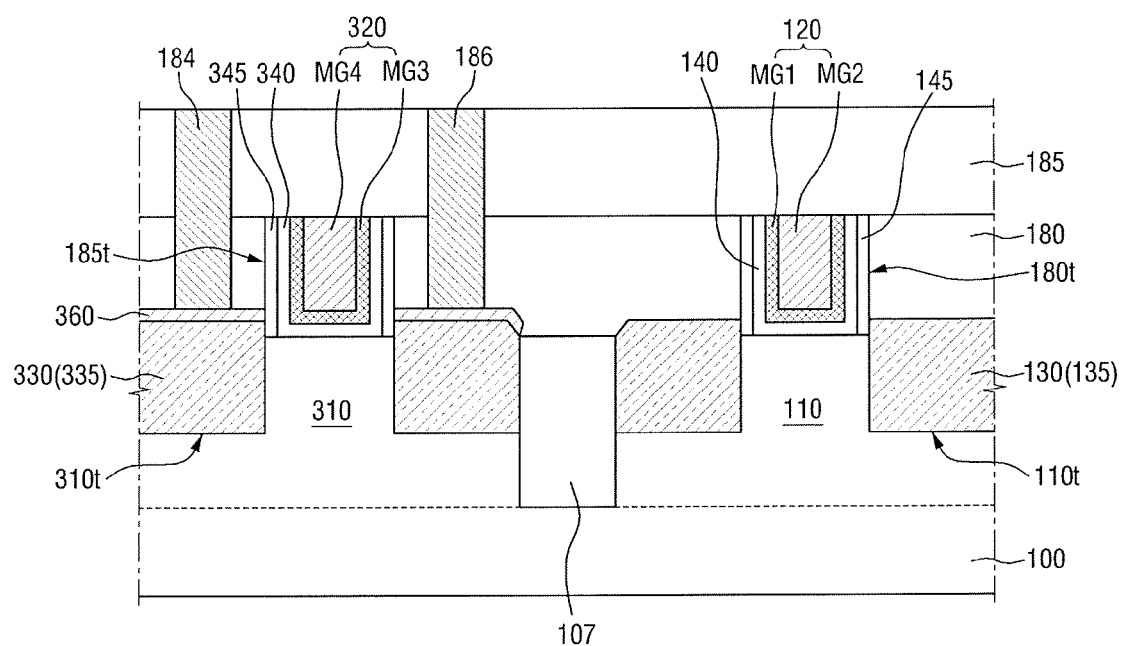
FIG. 29 is a view of a semiconductor device according to another embodiment of the present disclosure.

Referring to FIG. 29, a semiconductor device according to another embodiment of the present disclosure will be described. For convenience of explanation, duplicate descriptions with respect to FIGS. 24 to 28 will be simplified or omitted.

FIG. 29 is a view of a semiconductor device according to another embodiment of the present disclosure. For reference, FIG. 29 is a cross-sectional view cut along line I-I of FIG. 24.

Referring to FIG. 29, in a semiconductor device 12 according to another embodiment of the present disclosure, the first semiconductor region 130 includes the first epitaxial layer 135.

The first epitaxial layer 135 is disposed in the second trench 110t in the first fin pattern 110.

In the semiconductor device 12 according to another embodiment of the present disclosure, the source/drain 330 and the first semiconductor region 130 respectively include the third epitaxial layer 335 and the first epitaxial layer 135.

The first epitaxial layer 135 and the third epitaxial layer 335 may respectively include the same material or may include different materials. Further, the first epitaxial layer 135 and the third epitaxial layer 335 may be formed by the same process or by different processes.

Referring to FIGS. 30 to 33, a semiconductor device according to further embodiments of the present disclosure will be described. For convenience in explanation, duplicate descriptions with respect to FIGS. 24 to 28 will be simplified or omitted.

Figure 30:
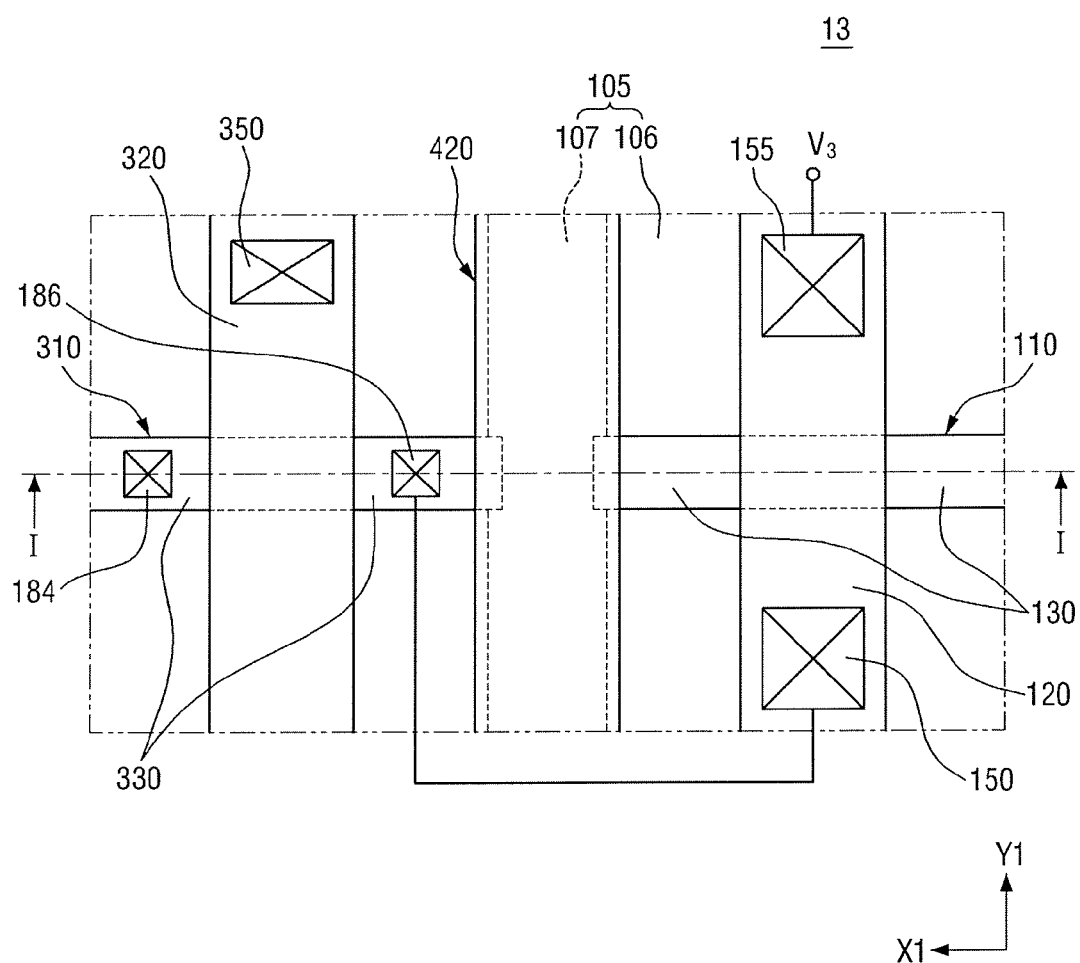
FIGS. 30 and 31 are views of a semiconductor device according to another embodiment of the present disclosure.
Figure 31:
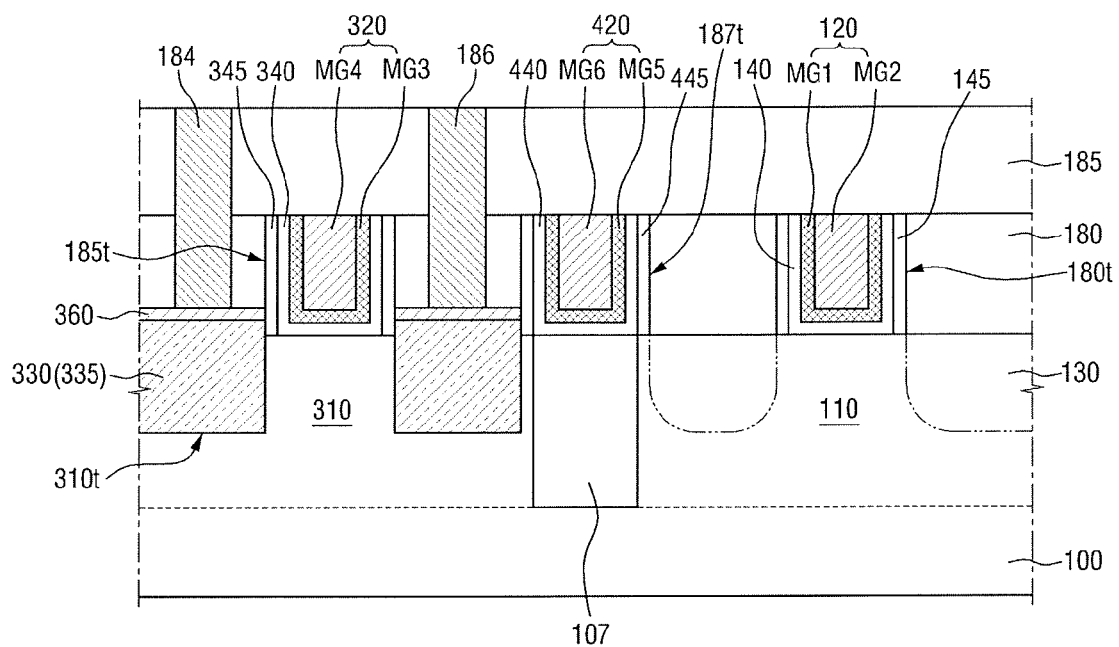
Figure 32:
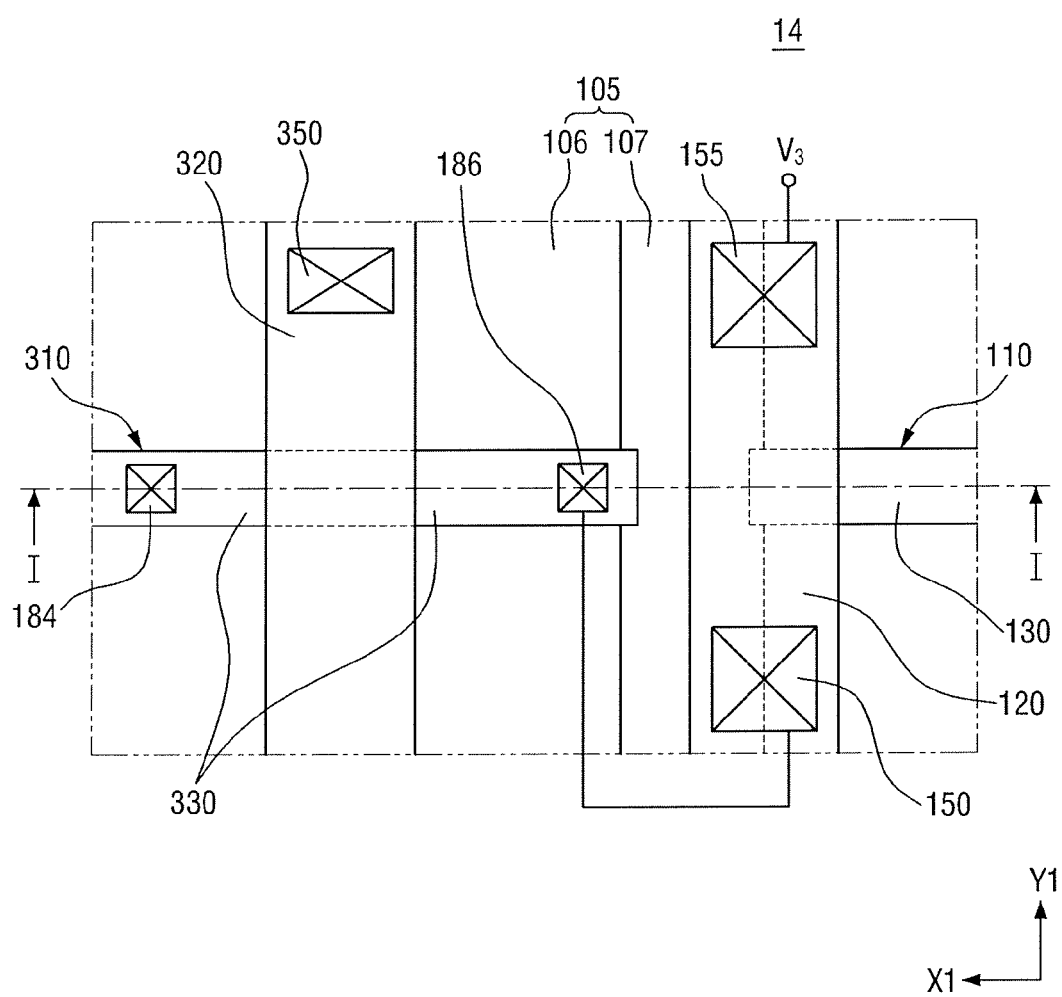
FIGS. 32 and 33 are views of a semiconductor device according to another embodiment of the present disclosure.
Figure 33:
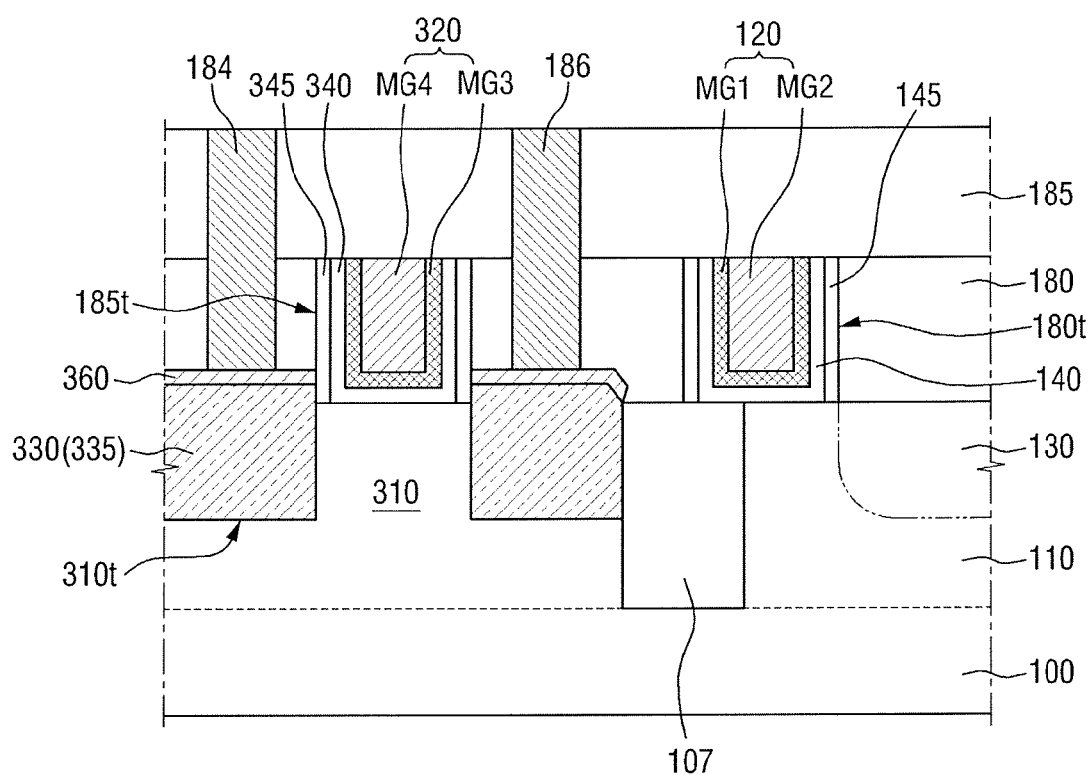

FIGS. 30 and 31 are views of a semiconductor device according to another embodiment of the present disclosure, and FIGS. 32 and 33 are views of a semiconductor device according to a yet another embodiment of the present disclosure. For reference, FIGS. 30 and FIG. 32 are layout diagrams of a semiconductor device according to respective embodiments of the present disclosure. FIGS. 31 and 33 are cross-sectional views cut along line I-I of FIG. 30 and line I-I of FIG. 32, respectively.

Referring to FIGS. 30 and 31, a semiconductor device 13 according to the thirteenth embodiment of the present disclosure further includes a dummy gate electrode 420.

The dummy gate electrode 420 is disposed on the second region 107 of the field insulating layer 105. The dummy gate electrode 420 is disposed in the first interlayer insulating layer 180 and is disposed in a sixth trench 187t that extends in the second direction Y1. That is, the dummy gate electrode 420 may extend in the second direction Y1.

The dummy gate electrode 420 may be disposed between the gate electrode 320 that crosses the third fin pattern 310 and the first conductive pattern 120 that crosses the first fin pattern 110. The dummy gate electrode 420 may be electrically floated.

The source/drain 330 positioned on one side of the dummy gate electrode 420 is a region to which an electrical signal is applied. However, the first semiconductor region 130 positioned on the other side of the dummy gate electrode 420 is a region which is electrically floated and to which no electrical signal is applied.

The dummy gage electrode 420 may include metal layers MG5 and MG6. The dummy gate electrode 420 may be formed by the same process as the gate electrode 320, but is not limited thereto. Further, the dummy gate electrode 420 may have the same material as the gate electrode 320 and the same stacking structure as the gate electrode 320, but is not limited thereto.

Referring to FIGS. 32 and 33, in a semiconductor device according to another embodiment of the present disclosure, the first semiconductor region 130 is positioned on one side of the first conductive pattern 120, but not on the other side thereof.

For example, the first semiconductor region 130 is positioned on one side of the first conductive pattern 120, and the second region 107 of the field insulating layer 105 is positioned on the other side of the first conductive pattern 120. That is, the first semiconductor region 130 is not positioned on each side in the first direction X1 around the first conductive pattern 120.

In the semiconductor device 14 according to another embodiment of the present disclosure, the upper surface of the second region 107 may be coplanar with the upper surface of the first fin pattern 110 and the upper surface of the third fin pattern 310. Alternatively, the upper surface of the second region 107 may be higher than the upper surface of the first fin pattern 110 and the upper surface of the third fin pattern 310.

At least a part of the first conductive pattern 120 crosses the first fin pattern 110. Further, a part of the first conductive pattern 120 may be disposed on the second region 107 of the field insulating layer 105. That is, the first conductive pattern 120 may include a portion disposed on the first region 106 and a portion disposed on the second region 107.

The width of the first conductive pattern 120 in the first direction X1 may be larger than the width of the overlap region of the first fin pattern 110 and the first conductive pattern 20, but is not limited thereof.

Figure 34:
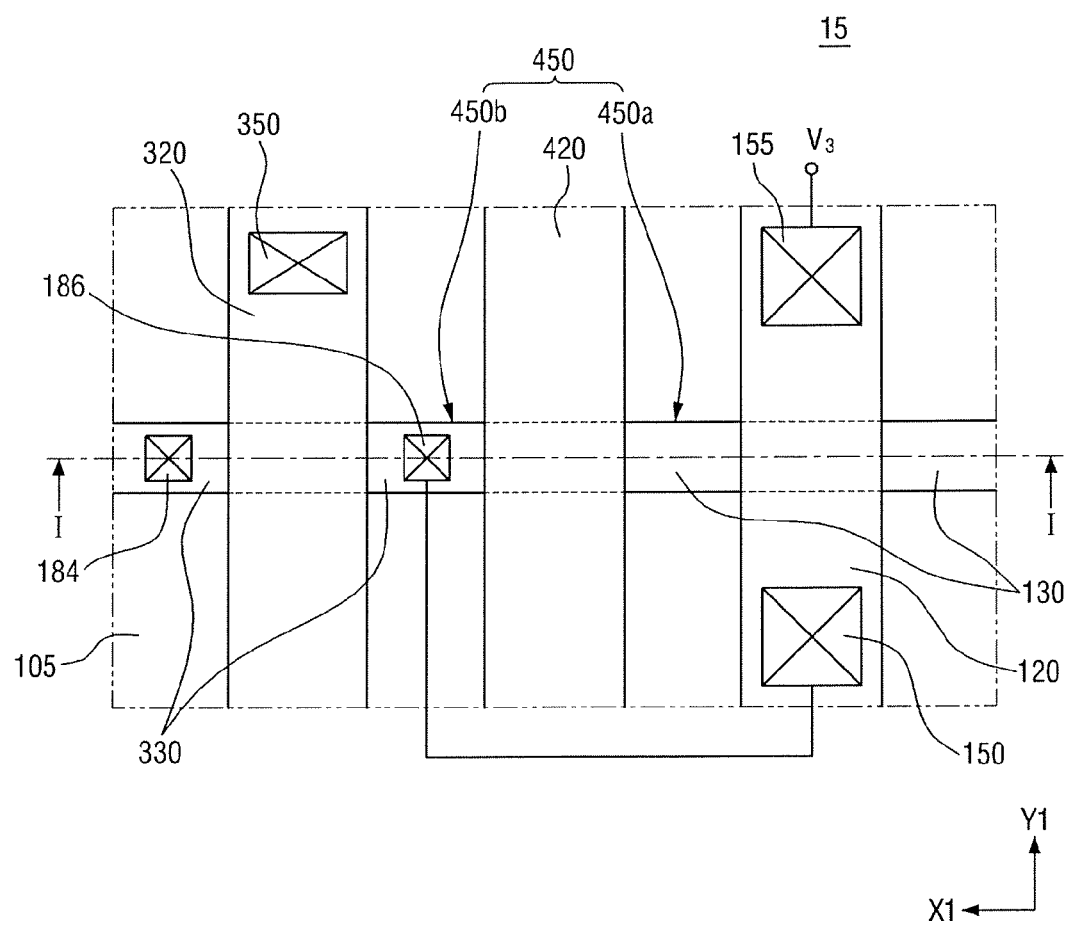
FIGS. 34 and 35 are views of a semiconductor device according to another embodiment of the present disclosure.
Figure 35:
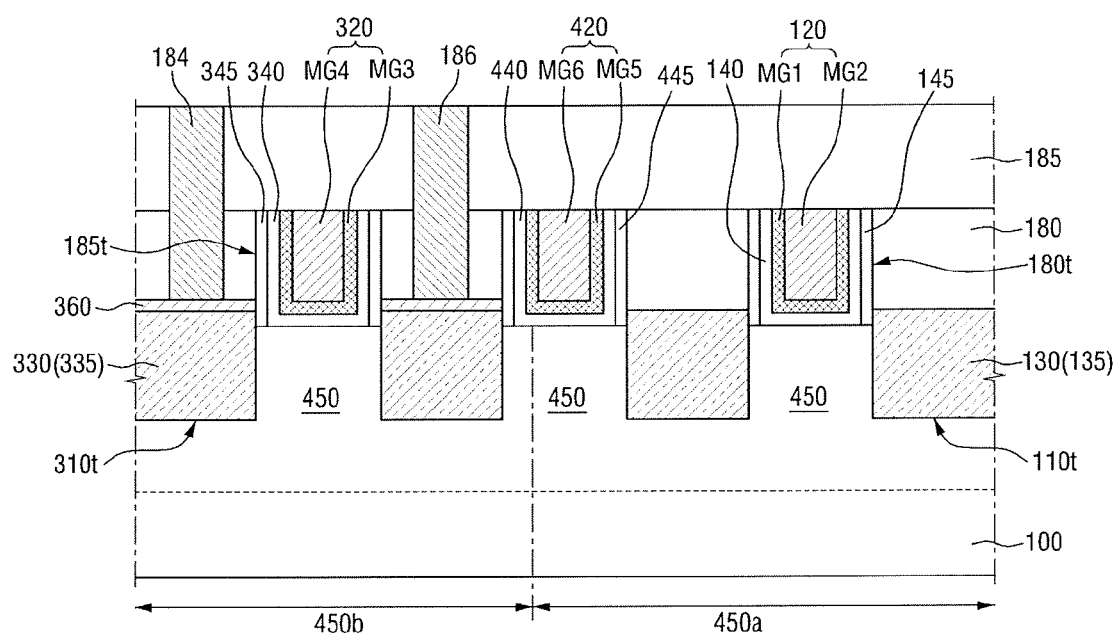

Referring to FIGS. 34 and 35, a semiconductor device according to another embodiment of the present disclosure will be described.

FIGS. 34 and 35 are views of a semiconductor device according to another embodiment of the present disclosure. For reference, FIG. 34 is a layout diagram of a semiconductor device according to another embodiment of the present disclosure, and FIG. 35 is a cross-sectional view cut along line I-I of FIG. 34.

Referring to FIGS. 34 and 35, a semiconductor device 15 according to another embodiment of the present disclosure may include a fourth fin pattern 450, a first conductive pattern 120, a gate electrode 320, a dummy gate electrode 420, a first semiconductor region 130, a source/drain 330, a first contact 150, and a second contact 155.

The fourth fin pattern 450 is defined by the field insulating layer 105 in the same manner as the first fin pattern 110. The upper surface of the fourth fin pattern 450 may project above the upper surface of the field insulating layer 105.

The fourth fin pattern 450 extends in the first direction X1. The fourth fin pattern 450 may include a first region 450a and a second region 450b. As illustrated, the first and second regions 450a, 450b of the fourth fin pattern may be directly connected to each other.

The first conductive pattern 120 may be disposed on the field insulating layer 105 and the first region 450a of the fourth fin pattern. The first conductive pattern 120 extends in the second direction Y1. The first conductive pattern 120 crosses the first region 450a of the fourth fin pattern.

For example, the width of the region where the first conductive pattern 120 overlaps the first region 450a of the fourth fin pattern may be equal to the width of the first conductive pattern 120 in the first direction X1.

The gate electrode 320 may be disposed on the field insulating layer 105 and the second region 450b of the fourth fin pattern. The gate electrode 320 extends in the second direction Y1. The gate electrode 320 crosses the second region 450b of the fourth fin pattern.

The dummy gate electrode 420 is disposed on the field insulating layer 105 and extends in the second direction Y1. The dummy gate electrode 420 is disposed between the first conductive pattern 120 and the gate electrode 320. The dummy gate electrode 420 is electrically floated.

Depending on how a boundary between the first and second regions 450a, 450b of the fourth fin pattern is determined, the region where the dummy gate electrode 420 crosses the fourth fin pattern 450 may differ. Accordingly, the dummy gate electrode 420 may cross the first region 450a of the fourth fin pattern 450a and/or the second region 450b of the fourth fin pattern.

In other words, the first conductive pattern 120, the dummy gate electrode 420, and the gate electrode 320 may cross the fourth fin pattern 450.

The first semiconductor region 130, which is electrically floated, may be positioned on each side of the first conductive pattern 120. The first semiconductor region 130 may include the first epitaxial layer 135 disposed in the fourth fin pattern 450, but is not limited thereto.

The source/drain 330 to which an electric signal is applied may be disposed on each side of the gate electrode 320. The source/drain 330 may include the third epitaxial layer 335 disposed in the fourth fin pattern 450, but is not limited thereto.

The source/drain 330 to which an electrical signal is applied is disposed between the dummy gate electrode 420 and the gate electrode 320. The electrically floated first semiconductor region 130 may be positioned between the dummy gate electrode 320 and the first conductive pattern 120.

Different voltages may be respectively connected to the first contact 150 and the second contact 155.

Figure 36:
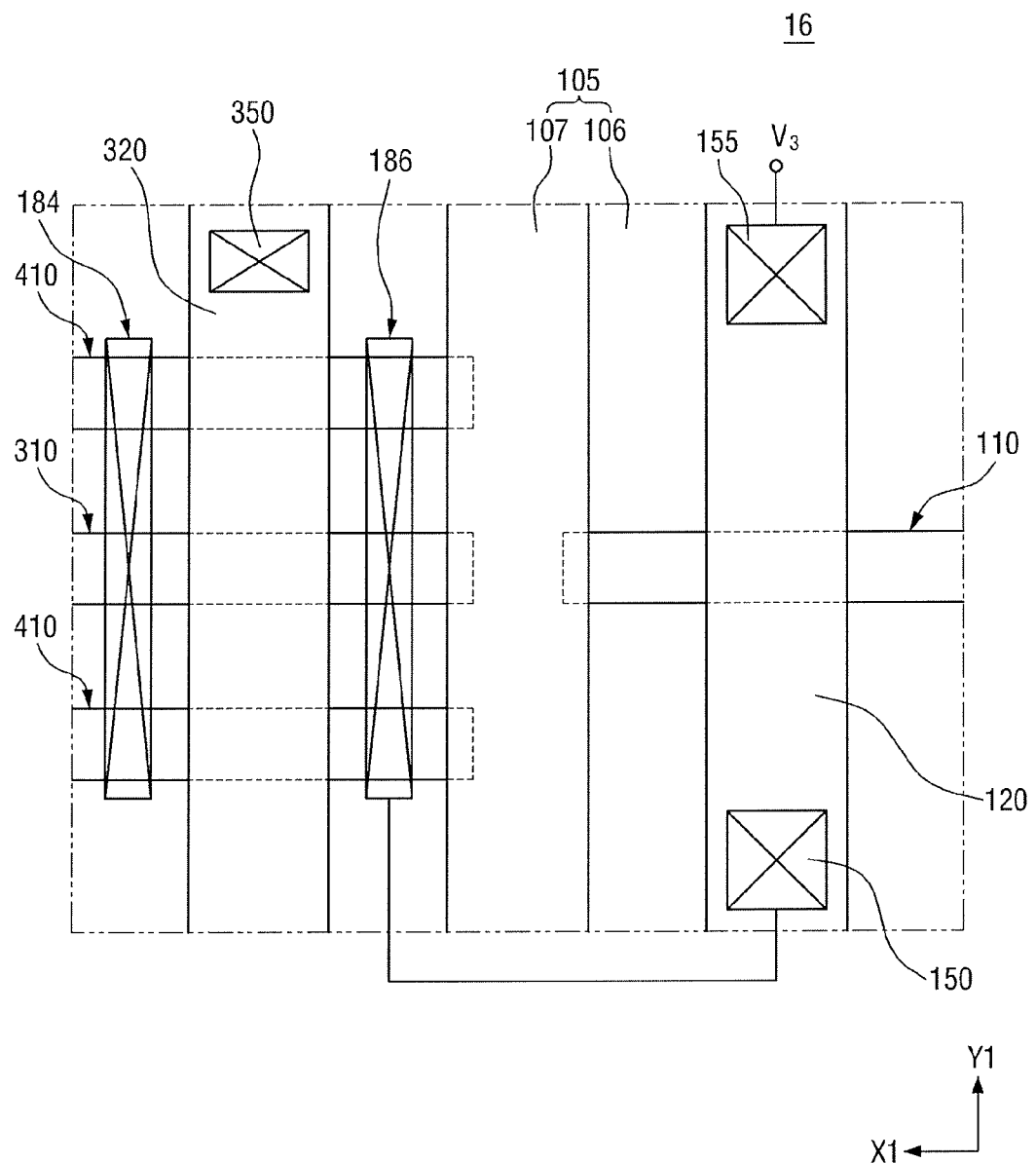
FIG. 36 is a layout diagram of a semiconductor device according to another embodiment of the present disclosure.
Figure 37:
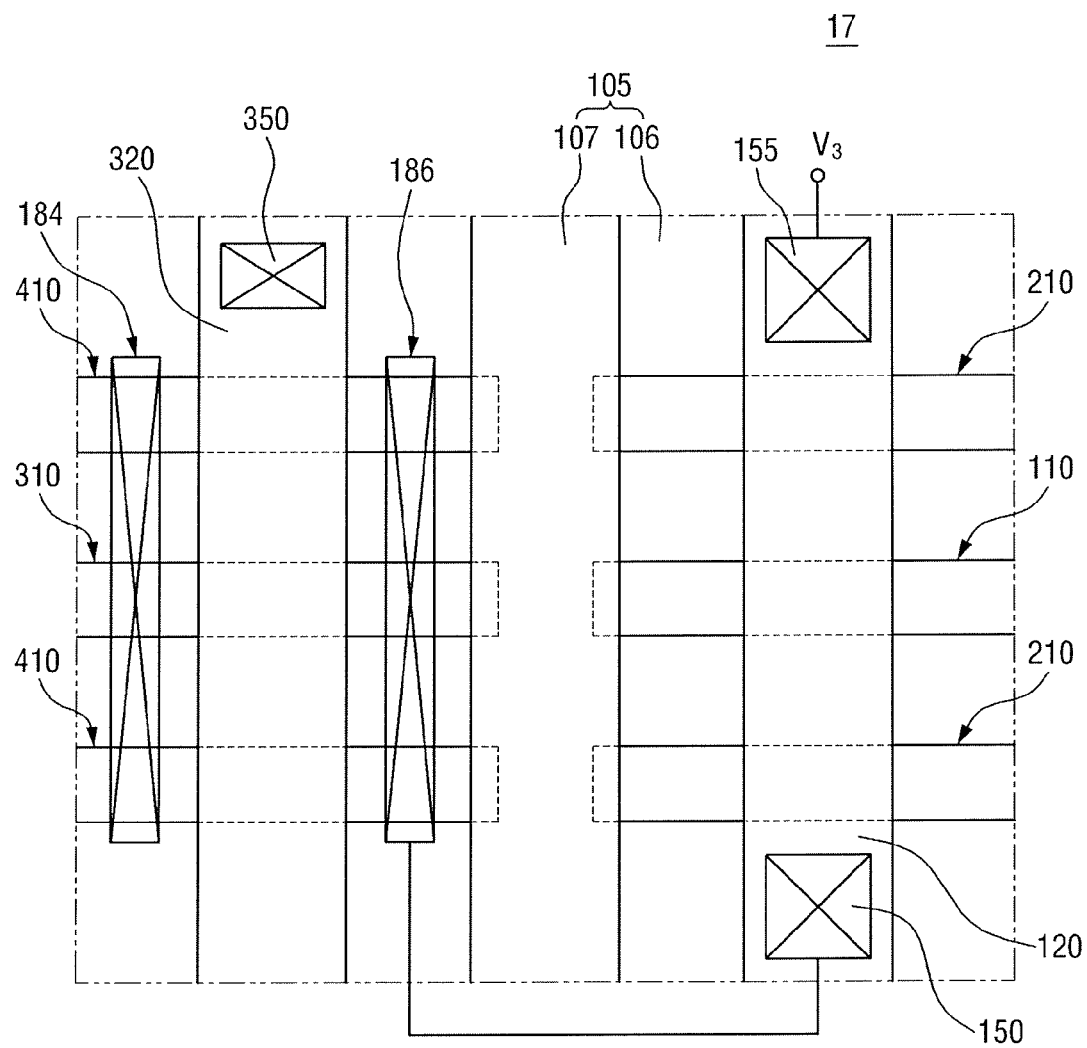
FIG. 37 is a layout diagram of a semiconductor device according to another embodiment of the present disclosure.
Figure 38:
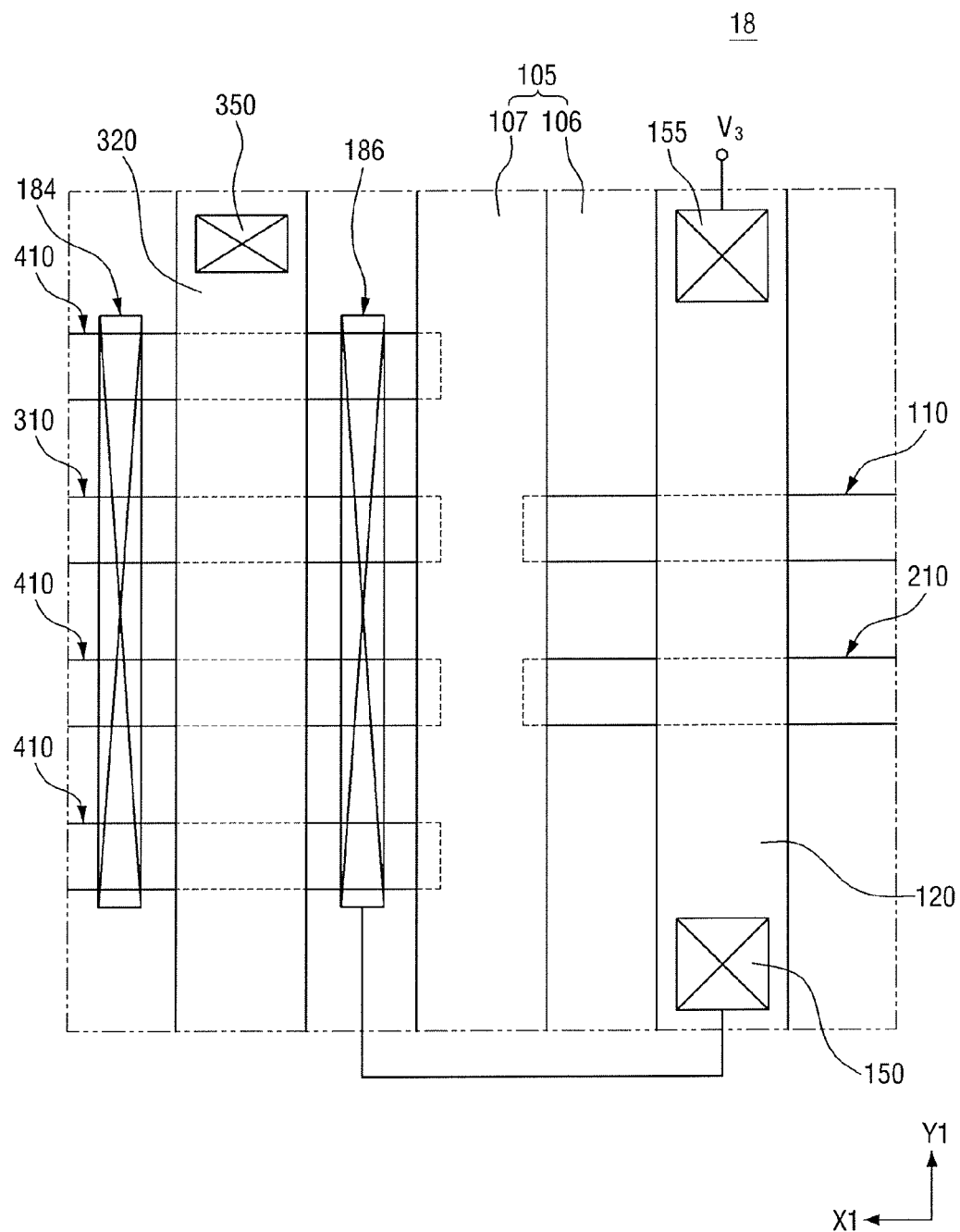
FIG. 38 is a layout diagram of a semiconductor device according to another embodiment of the present disclosure.

Referring to FIGS. 36 to 38, a semiconductor device according to further embodiments of the present disclosure will be described. For convenience in explanation, duplicate descriptions with respect to FIGS. 24 to 28 will be simplified or omitted.

FIG. 36 is a layout diagram of a semiconductor device according to another embodiment of the present disclosure. FIG. 37 is a layout diagram of a semiconductor device according to yet another embodiment of the present disclosure. FIG. 38 is a layout diagram of a semiconductor device according to a further embodiment of the present disclosure.

Referring to FIG. 36, a semiconductor device 16 according to another embodiment of the present disclosure may further include at least one fifth fin pattern 410 that faces the third fin pattern 310 in a lengthwise direction.

Specifically, the fifth fin pattern 410 extends in the first direction X1 parallel to the third fin pattern 310.

The first region 106 of the field insulating layer 105 is in contact with the third fin pattern 310 and the fifth fin pattern 410. The first region 106 is positioned between the third fin pattern 310 and the fifth fin pattern 410. The second region 107 of the field insulating layer 105 is in contact with an end side of the third fin pattern 310 and an end side of the fifth fin pattern. The fifth fin pattern 410 is defined by the first region 106 and the second region 107 of the field insulating layer 105 in the same manner as the third fin pattern 310.

The second region 107 may surround the end side of the third fin pattern 310 and the end side of the fifth fin pattern 410. The second region 107 may extend in the second direction Y1.

Since the first region 106 of the field insulating layer 105 is in contact with a part of a side surface of the fifth fin pattern 410, the upper surface of the fifth fin pattern 410 projects above the upper surface of the first region 106.

The gate electrode 320 crosses the third fin pattern 310 and the fifth fin pattern 410. The gate electrode 320 is disposed on the third fin pattern 310 and the fifth fin pattern 410. However, the first conductive pattern 120 does not cross the fifth fin pattern 410.

In other words, a plurality of fin patterns 310 and 410 cross the gate electrode 320, but one fin pattern 110 crosses the first conductive pattern 120.

In FIG. 36, the semiconductor device 16 according to another embodiment of the present disclosure is described as further including at least one fifth fin pattern 410 that faces the third fin pattern 310 in the lengthwise direction, but is not limited thereto.

That is, the semiconductor device 16 may lack a fifth fin pattern 410 that faces the third fin pattern 310 in the lengthwise direction, but may further include at least one second fin pattern 210 that faces the first fin pattern 110 in the lengthwise direction.

In other words, although one fin pattern 310 crosses the gate electrode 320, a plurality of fin patterns 110 and 210 cross the first conductive pattern 120.

As a result, in a semiconductor device according to another embodiment of the present disclosure, the ratio of the number of fin patterns that cross the first conductive pattern 120 to the number of fin patterns that cross the gate electrode 320 may be 1:n or n:1, where, n is a natural number that is greater than or equal to 2.

Although the drawing shows the seventh contact 184 and the eighth contact 186 as being commonly disposed on the third fin pattern 310 and the fifth fin pattern 410, they are not limited thereto.

Referring to FIG. 37, a semiconductor device 17 according to the another embodiment of the present disclosure may further include at least one fifth fin pattern 410 that faces the third fin pattern 310 in the lengthwise direction and at least one second fin pattern 210 that faces the first fin pattern 110 in the lengthwise direction.

Specifically, the second fin pattern 210 and the fifth fin pattern 410 extend in the first direction X1. The first fin pattern 110 extends parallel to the second fin pattern 210, and the third fin pattern 310 extends parallel to the fifth fin pattern 410.

The first region 106 of the field insulating layer 105 is in contact with the first fin pattern 110, the second fin pattern 210, the third fin pattern 310, and the fifth fin pattern 410. The first region 106 is positioned between the first fin pattern 110 and the second fin pattern 210, and also between the third fin pattern 310 and the fifth fin patter 410.

The first fin pattern 110, the second fin pattern 210, the third fin pattern 310, and the fifth fin pattern 410 are defined by the first region 106 and the second region 107 of the field insulating layer 105 in the same manner as the first fin pattern 110.

The second region 107 of the field insulating layer 105 may surround the end side of the first fin pattern 110, the end side of the second fin pattern 210, the end side of the third fin pattern 310, and the end side of the fifth fin pattern 410. The second region 107 of the field insulating layer may extend in the second direction Y1.

Since the first region 106 of the field insulating layer 105 is in contact with a part of the side surface of the fifth fin pattern 410 and a part of the side surface of the fifth fin pattern 410, the upper surface of the second fin pattern 210 and the upper surface of the fifth fin pattern 410 project above the upper surface of the first region 106.

In a semiconductor device according to another embodiment of the present disclosure, the number of fin patterns 110 and 210 that cross the first conductive pattern 120 may be equal to the number of fin patterns 310 and 410 that cross the gate electrode 320.

Although the drawing shows the seventh contact 184 and the eighth contact 186 as being commonly disposed on the third fin pattern 310 and the fifth fin pattern 410, they are not limited thereto.

Further, the semiconductor regions of the first fin pattern 110 and the second fin pattern 210 that do not overlap the first conductive pattern 120 are electrically floated.

Referring to FIG. 38, in the semiconductor device 18 according to another embodiment of the present disclosure, the number of fin patterns 110 and 210 that cross the first conductive pattern 120 is m, and the number of fin pattern 310 and 410 that cross the gate electrode 320 is n. Here, m and n are different natural numbers that are greater than or equal to 2.

Figure 39:
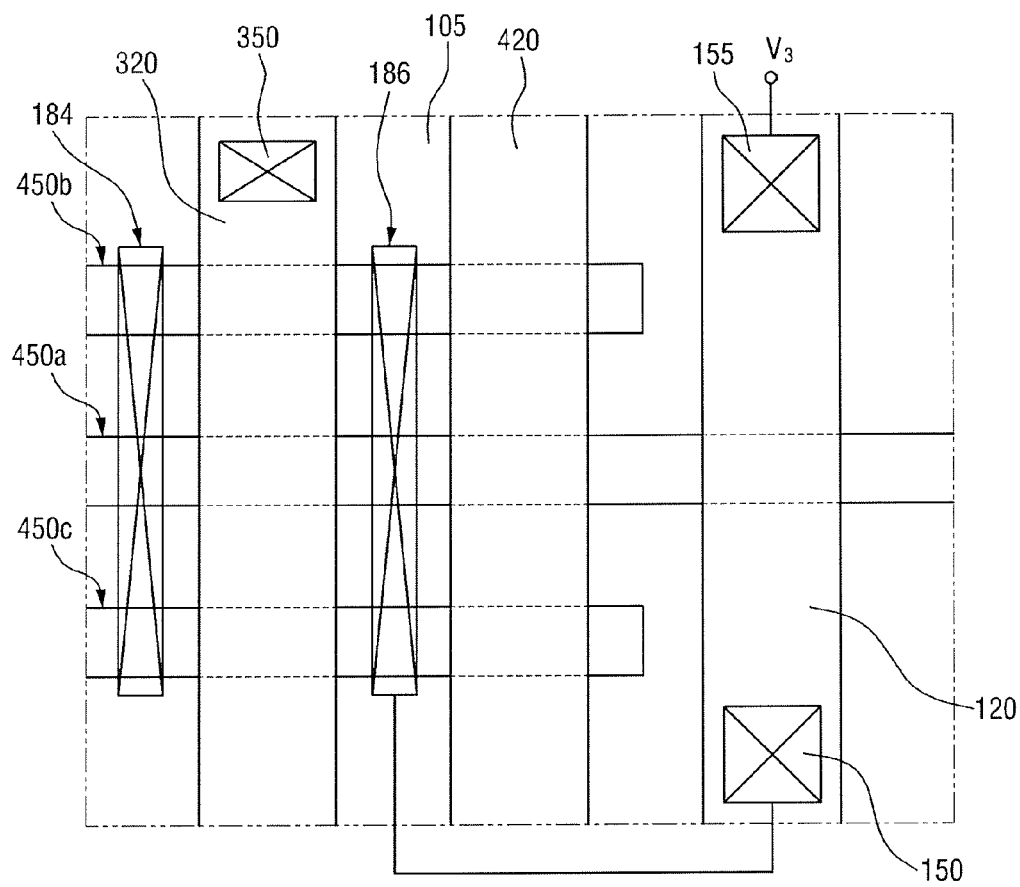
FIG. 39 is a layout diagram of a semiconductor device according to another embodiment of the present disclosure.

Referring to FIG. 39, a semiconductor device according to another embodiment of the present disclosure will be described. For convenience in explanation, duplicate descriptions with respect to FIGS. 34 and 35 will be simplified or omitted.

FIG. 39 is a layout diagram of a semiconductor device according to another embodiment of the present disclosure.

Referring to FIG. 39, a semiconductor device 19 according to another embodiment of present disclosure includes a plurality of fourth fin patterns 450a, 450b, and 450c that face each other in the lengthwise direction.

The gate electrode 320 may cross the plurality of fourth fin pattern 450a, 450b, and 450c.

However, for example, the first conductive pattern 120 may cross one fourth fin pattern 450a, but not the remaining fourth fin patterns 450b and 450c.

As illustrated in the drawing, the dummy gate electrode 420 may cross the fourth fin patterns 450a, 450b, and 450c, but is not limited thereto. Like the first conductive pattern 120, the dummy gate electrode 420 may cross one fourth fin pattern 450a, but not the remaining fourth fin patterns 450b and 450c.

FIG. 39 shows that the number of fourth fin patterns 450a, 450b, and 450c that cross the gate electrode 320 is larger than the number of fourth fin pattern 450a that cross the first conductive pattern 120, but is not limited thereto.

That is, unlike the case illustrated in FIG. 39, the number of fourth fin patterns 450a, 450b, and 450c that cross the first conductive pattern 120 may be larger than the number of fourth fin patterns 450a, 450b, and 450c that cross the gate electrode 320.

In other words, in a semiconductor device according to another embodiment of the present disclosure, the number of fin patterns that cross the first conductive pattern 120 may be different from the number of fin patterns that cross the gate electrode 320.

That is, the ratio of the number of fin patterns that cross the first conductive pattern to the number of fin patterns that cross the gate electrode 320 may be m:n. Here, m and n are different natural numbers that are greater than or equal to 2.

FIG. 39 illustrates that the number of fin patterns that cross the first conductive pattern 120 is different from the number of fin patterns that cross the gate electrode 320. However, in a modified example of a semiconductor device as described above with respect to FIG. 37, the number of fin patterns that cross the first conductive pattern 120 may be equal to the number of fin patterns that cross the gate electrode 320.

Figure 40:
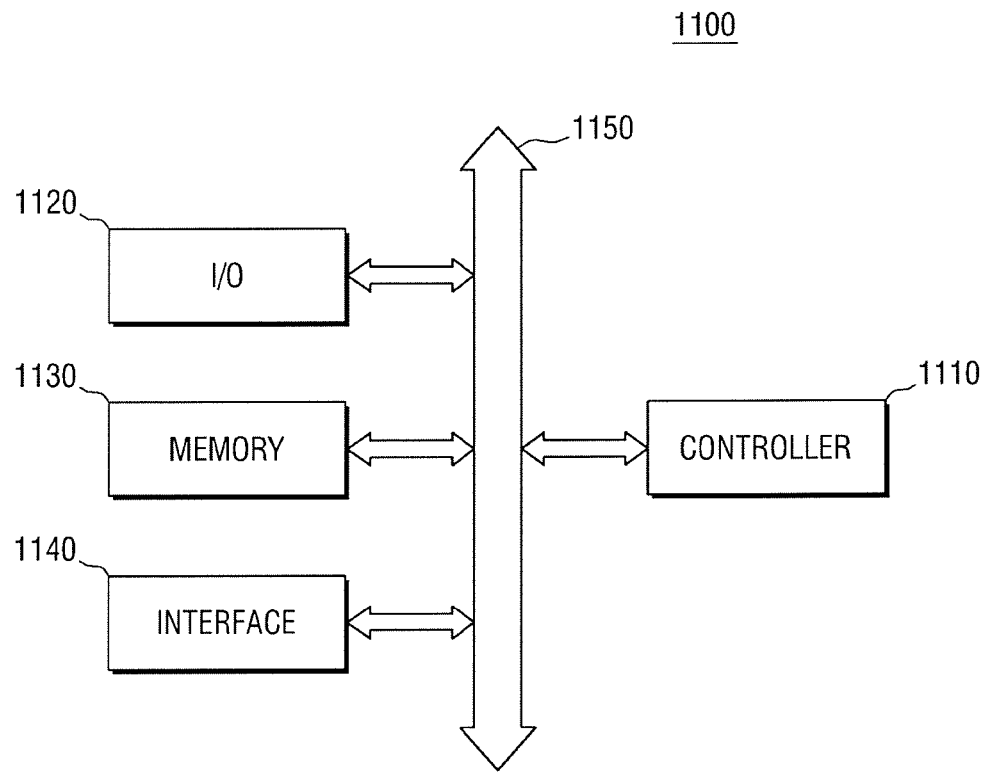
FIG. 40 is a schematic block diagram illustrating an example of a memory system that includes a fuse structure or a semiconductor device including the same according to embodiments of the present disclosure.

FIG. 40 is a schematic block diagram illustrating an example of a memory system that includes a fuse structure or a semiconductor device including the same according to embodiments of the present disclosure.

Referring to FIG. 40, a memory system 1100 may be used in a PDA, a portable computer, a web tablet, a wireless phone, a mobile phone, a digital music player, a memory card, or any other device that can transmit and/or receive information in a wireless environment.

The memory system 1100 includes a controller 1110, an input/output device 1120 such as a keypad, a keyboard, and a display, a memory 1130, an interface 1140, and a bus 1150. The memory 1130 and the interface communicate with each other through the bus 1150.

The controller 1110 may include at least one microprocessor, digital signal processor, micro controller, or other similar processors. The memory 1130 may be used to store commands performed by the controller 1410. The input/output device 1120 may receive an input of externally supplied data or signals, and may output data or signal. For example, the input/output device 1120 may include a keyboard, a keypad, or a display device.

The memory 1130 may include a nonvolatile memory device. The memory 130 may further include other kinds of memories, such as a volatile memory that can be optionally accessed at any time.

The interface 1140 serves to transmit data to a communication network or to receive data from the network.

Figure 41:
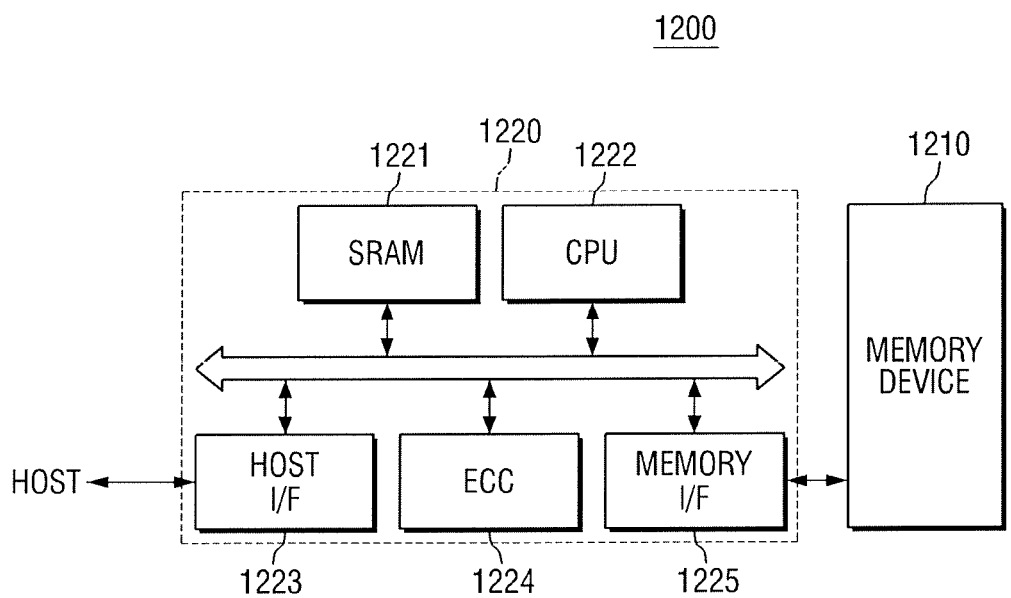
FIG. 41 is a schematic block diagram illustrating an example of a memory card that includes a fuse structure or a semiconductor device including the same according to embodiments of the present disclosure.

FIG. 41 is a schematic block diagram illustrating an example of a memory card that includes a fuse structure or a semiconductor device including the same according to embodiments of the present disclosure.

Referring to FIG. 41, the memory card 1200 for supporting a high-capacity data storage capability includes a flash memory device 1210 mounted therein according to the present disclosure. The memory card 1200 according to the present disclosure includes a memory controller 1220 that controls date exchange between a host and the flash memory device 1210.

An SRAM 1221 is used as an operating memory of a central processing unit 1222. A host interface 1223 includes a data exchange protocol for the host to access the memory card 1200. An error correction code 1224 may detect and correct errors in data read from the multi-bit flash memory 1210. A memory interface 1225 interfaces with the flash memory device 1210 according to the present disclosure. The central processing unit 1222 controls the overall operation of data exchange with the memory controller 1220. In addition, a memory card according to embodiments of the present disclosure may further include a ROM to store code data for interfacing with the host.

Figure 42:
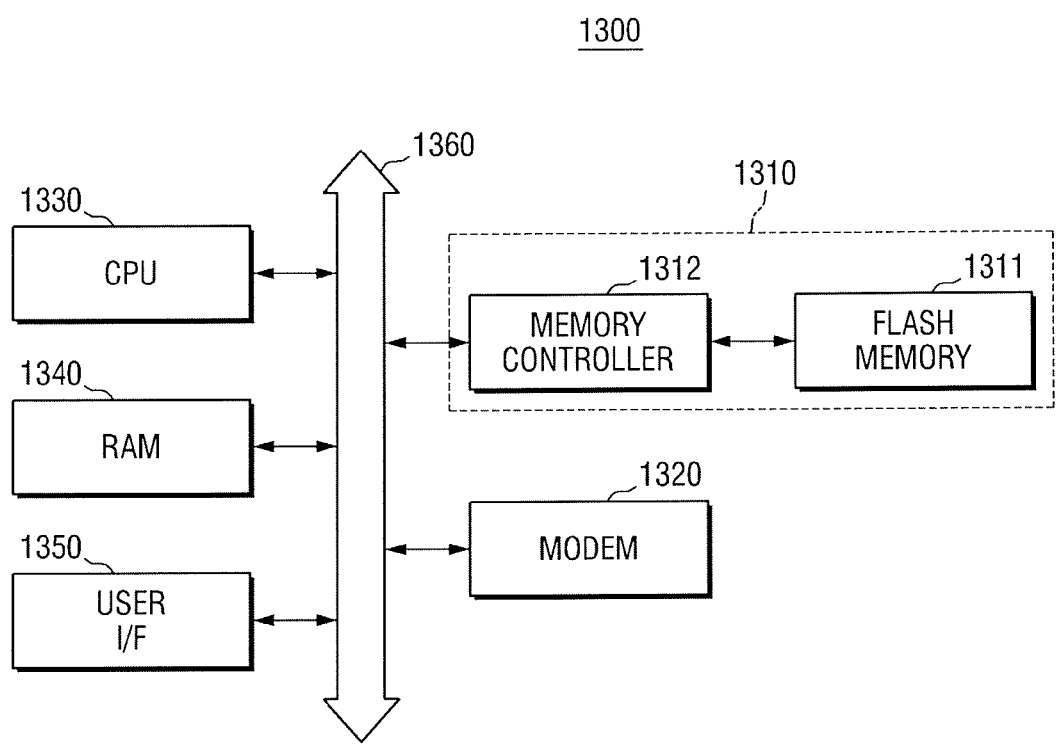
FIG. 42 is a schematic block diagram illustrating an example of an information processing system that includes a fuse structure or a semiconductor device including the same mounted thereon according to embodiments of the present disclosure.

FIG. 42 is a schematic block diagram illustrating an example of an information processing system that includes a fuse structure or a semiconductor device including the same mounted thereon according to embodiments of the present disclosure.

Referring to FIG. 42, an information processing system 1300, such as a mobile device or a desk top computer, includes a memory system 1310 mounted therein according to embodiments of the present disclosure. The information processing system 1300 according to another embodiment of the present disclosure includes a modem 1320 electrically connected to the memory system 1310 and a system bus 1360, a central processing unit 1330, a RAM 1340, and a user interface 1350. The memory system 1310 may include a flash memory 1311 and a memory controller 1312, and may have substantially the same configuration as the memory system described above with respect to FIG. 41. Data that is processed by the central processing unit 1330 and data that is received from an external device are stored in the memory system 1310. Here, the above-described memory system 1310 may be comprised of a semiconductor disk device (SSD), and in this case, the information processing system 1300 can stably store large-capacity data in the memory system 1310. Further, as reliability increases, the memory system 1310 can reduce the number of resources required to perform error correction, and thus a high-speed data exchange function can be provided to the information processing system 1300. In addition, it will be apparent to those of ordinary skill in the art that the information processing system 1300 according to embodiments of the present disclosure may further include an application chipset, a camera image processor CIS, and an input/output device.

Although exemplary embodiments of the present disclosure have been described for illustrative purposes, those skilled in the art will appreciate that various modifications, additions and substitutions are possible, without departing from the scope and spirit of the disclosure as disclosed in the accompanying claims.

What is claimed is:

1. A fuse structure comprising:
   a first fin pattern disposed in a field insulating layer that includes an upper surface that projects above an upper surface of the field insulating layer;
   a conductive pattern on the field insulating layer that crosses the first fin pattern;
   a first semiconductor region positioned on at least one side of the conductive pattern; and
   first and second contacts disposed on, and in electrical contact with, the conductive pattern on each side of the first fin pattern,
   wherein different voltages are respectively applied to the first contact and the second contact.

2. The fuse structure of claim 1, wherein the conductive pattern has a first thickness on the first fin pattern, and a second thickness on the field insulating layer, and
   the first thickness and the second thickness differ from each other.

3. The fuse structure of claim 1, wherein a width of a region where the conductive pattern overlaps the first fin pattern is equal to a width of the conductive pattern, and
   wherein the first semiconductor region is positioned on each side of the conductive pattern.

4. The fuse structure of claim 1, wherein the field insulating layer comprises a first region and a second region,
   wherein the first fin pattern is disposed in the first region of the field insulating layer but not the second region of the field insulating layer, the first region is positioned on one side of the conductive pattern, and the second region is positioned on the other side of the conductive pattern, and a height of the second region is higher than a height of the first region.

5. The fuse structure of claim 4, wherein a portion of the conductive pattern is disposed on the second region of the field insulating layer.

6. The fuse structure of claim 1, wherein the first semiconductor region is electrically floated.

7. The fuse structure of claim 1, further comprising a metal alloy layer disposed on an upper surface of the first semiconductor region.

8. The fuse structure of claim 1, further comprising:
   a second fin pattern disposed in the field insulating layer that includes an upper surface that projects above an upper surface of the field insulating layer, and that crosses the conductive pattern; and
   a second semiconductor region positioned on at least one side of the conductive pattern portion.

9. The fuse structure of claim 8, wherein the first semiconductor region is connected to the second semiconductor region.

10. A fuse structure comprising:
    a fin pattern that extends in a first direction; and
    a conductive pattern that extends in a second direction different from the first direction and that crosses the fin pattern,
    wherein a first thickness of a first region of the conductive pattern that crosses the fin pattern is less than a second thickness of a second region of the conductive pattern that does not cross the fin pattern, and
    wherein a fuse is programmed by applying an electric signal to both ends of the conductive pattern, wherein a resistance of the first region increases.

11. A semiconductor device comprising:
    first and second fin patterns parallel to each other in a lengthwise direction that are disposed on a first field insulating layer, the first and second fin patterns each including an upper surface that projects above an upper surface of the first field insulating layer;
    a conductive pattern on the first field insulating layer that crosses the first fin pattern;
    first and second contacts disposed on the conductive pattern on each side of the first fin pattern, the first and second contacts having different voltages applied thereto;
    a first gate electrode disposed on the first field insulating layer that crosses the second fin pattern; and
    a source/drain disposed on each side of the first gate electrode, wherein one side of the source/drain is electrically connected to the first contact.

12. The semiconductor device of claim 11, wherein the conductive pattern has a first thickness on the first fin pattern, and a second thickness on the first field insulating layer, and the first thickness differs from the second thickness.

13. The semiconductor device of claim 11, wherein the first fin pattern is directly connected to the second fin pattern.

14. The semiconductor device of claim 11, further comprising a second field insulating layer positioned between the first fin pattern and the second fin pattern.

15. The semiconductor device of claim 14, wherein a portion of the conductive pattern is disposed on the second field insulating layer.

16. The semiconductor device of claim 14, further comprising a second gate electrode disposed on the second field insulating layer,
wherein the second gate electrode is electrically floated.

17. The semiconductor device of claim 11, further comprising at least one third fin pattern disposed in the first field insulating layer that faces and is parallel to the second fin pattern and that crosses the first gate electrode, wherein an upper surface of the at least one third fin pattern projects above an upper surface of the first field insulating layer.

18. The semiconductor device of claim 11, further comprising at least one fourth fin pattern disposed in the first field insulating layer that faces and is parallel to the first fin pattern and that crosses the first gate electrode, wherein an upper surface of the at least one fourth fin pattern projects above the upper surface of the first field insulating layer.

19. The semiconductor device of claim 11, further comprising a semiconductor region positioned on at least one side of the conductive pattern.

* * * * *